US006483357B2

(12) United States Patent
Kato et al.

(10) Patent No.: US 6,483,357 B2
(45) Date of Patent: Nov. 19, 2002

(54) SEMICONDUCTOR DEVICE REDUCED IN THROUGH CURRENT

(75) Inventors: Hiroshi Kato, Hyogo (JP); Fukashi Morishita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/811,578

(22) Filed: Mar. 20, 2001

(65) Prior Publication Data

US 2002/0047741 A1 Apr. 25, 2002

(30) Foreign Application Priority Data

Oct. 24, 2000 (JP) ....................................... 2000-323797

(51) Int. Cl.[7] ................................................. H03L 7/00
(52) U.S. Cl. ...................................................... 327/143
(58) Field of Search ............................. 327/77, 80, 81, 327/86, 88, 143, 198, 319, 333

(56) References Cited

U.S. PATENT DOCUMENTS

| | | | | |
|---|---|---|---|---|
| 5,446,404 A | * 8/1995 | Badyal et al. | .............. | 327/143 |
| 5,677,643 A | * 10/1997 | Tomita | ....................... | 327/143 |
| 5,847,587 A | * 12/1998 | Chen et al. | ................. | 327/143 |
| 6,281,716 B1 | * 8/2001 | Mihara | ....................... | 327/143 |

FOREIGN PATENT DOCUMENTS

| | | |
|---|---|---|
| JP | 04-285437 | 10/1992 |
| JP | 06-140499 | 5/1994 |
| JP | 10-290526 | 10/1998 |

* cited by examiner

*Primary Examiner*—Jeffrey Zweizig
(74) *Attorney, Agent, or Firm*—McDermott, Will & Emery

(57) ABSTRACT

A sense signal IVOFF is generated by a power supply level sense circuit with an external power supply potential Ext.Vcc1 as the operating power supply potential to sense the level of an external power supply potential Ext.Vcc2. By suppressing generation of an internal power supply potential or fixing the internal node by the sense signal IVOFF, the through current at the time of power on can be reduced.

13 Claims, 17 Drawing Sheets

SEMICONDUCTOR DEVICE REDUCED IN THROUGH CURRENT

BACKGROUND OF THE INVENTION

1. Field of the Invention

The present invention relates to semiconductor devices, particularly to a semiconductor device including a plurality of internal circuits using a plurality of power supply potentials respectively.

2. Description of the Background Art

In a semiconductor device receiving a plurality of external power supply potentials, a great amount of through current may flow depending upon the sequence of turning on the power supply. For example, a level conversion circuit is known as such a circuit through which through current flows. When the first external power supply potential is higher than the second external power supply potential in a semiconductor device receiving the first and second external power supply potentials, through current will flow through the level conversion circuit that converts the level of the second external power supply potential to the level of the first external power supply potential in the semiconductor device.

In the event that the second external power supply potential is first applied, and then the first external power supply potential is applied, no through current will flow. However, if the external power supply potentials are applied in an opposite order, there will be a flow of through current.

The through current in a level conversion circuit will be described with reference to the drawings.

FIG. 21 is a diagram to describe the symbols employed in the present specification.

Referring to FIG. 21, a P channel MOS transistor 502, an N channel MOS transistor 504 and an inverter 506 are circuit elements formed of MOS transistors whose gate oxide films are of the thin type employed in the circuit where a power supply potential Ext.Vcc2 corresponding to the second external power supply potential is used as the operating power supply potential.

In contrast, a P channel MOS transistor 508, an N channel MOS transistor 510 and an inverter 512 are circuit elements formed of MOS transistors whose gate oxide films are thick in the circuit where a power supply potential Ext.Vcc1 corresponding to the first external power supply potential higher than the second internal power supply potential is used as the operating power supply potential. A higher voltage can be applied by setting the gate oxide film thicker.

FIG. 22 is a circuit diagram showing a structure of a first conventional level conversion circuit converting the H level of a signal to a higher potential from a lower potential.

Referring to FIGS. 21 and 22, the level conversion circuit includes an inverter 518 receiving and inverting a signal SIG, an N channel MOS transistor 520 having a gate receiving signal SIG and a source connected to the ground node, an N channel MOS transistor 522 receiving the output of inverter 518 and having a source connected to the ground node, a P channel MOS transistor 514 connected between the node receiving external power supply potential Ext.Vcc1 and the drain of N channel MOS transistor 520, having its gate connected to the drain of N channel MOS transistor 522, and a P channel MOS transistor 516 connected between the node receiving power supply potential Ext.Vcc1 and the drain of N channel MOS transistor 522, and having a gate connected to the drain of N channel MOS transistor 520.

From the drain of N channel MOS transistor 522 is output a signal /SIG with the amplitude between 0 V and power supply potential Ext.Vcc1. Signal /SIG is an inverted and level-converted version of signal SIG with the amplitude between 0 V and external power supply potential Ext.Vcc2.

Inverter 518 receives external power supply potential Ext.Vcc2 as the operating power supply potential. Therefore, inverter 518 is formed of a thin film transistor, i.e. a transistor with a thin gate oxide film. The other transistors 514, 516, 520 and 522 are the so-called thick film transistors with thick gate oxide films.

Through current flows through this level conversion circuit when external power supply potential Ext.Vcc1 is applied and power supply potential Ext.Vcc2 is not yet applied. More specifically, when signal SIG is in the vicinity of the threshold voltage of N channel MOS transistor 520 or at a higher intermediate potential, a through current Ic1 flows to N channel MOS transistor 520. When power supply potential Ext.Vcc1 is applied and power supply potential Ext.Vcc2 is not yet applied, the output of inverter 518 exhibits an unstable state. If the gate potential of N channel MOS transistor 522 is in the vicinity of the threshold voltage or at a higher intermediate potential, a through current Ic2 flows to N channel MOS transistor 522.

FIG. 23 is a circuit diagram showing a structure of a second conventional level conversion circuit converting the H level signal from a high potential to a low potential.

Referring to FIGS. 21 and 23, the level conversion circuit includes a P channel MOS transistor 582 receiving a signal SIGA at its gate and having its source connected to external power supply potential Ext.Vcc2, and an N channel MOS transistor 584 receiving signal SIGA at its gate, and connected between the drain of P channel MOS transistor 582 and the ground node. A signal /SIGA is output from the drain of P channel MOS transistor 582.

Signal SIGA has an L level corresponding to 0 V and an H level corresponding to power supply potential Ext.Vcc1. Signal /SIGA has an L level corresponding to 0 V and an H level corresponding to power supply potential Ext.Vcc2. It is to be noted that power supply potential Ext.Vcc2 is lower than power supply potential Ext.Vcc1. Transistors 582 and 584 are transistors with a gate oxide film of a thickness that can withstand power supply voltage Ext.Vcc1. Even in such a circuit of the above-described structure, through current will flow when the potential of external power supply potential Ext.Vcc1 is not yet applied at the state where the potential of external power supply potential Ext.Vcc2 is sufficiently high if signal SIGA is at the intermediate potential, i.e. in the vicinity exceeding the threshold voltage of N channel MOS transistor 584.

The through current at the time of power-on is basically great in any electrical product. Under the requirement of reducing such a through current as much as possible, it is not desirable that a semiconductor device has a structure that increases the through current at the time of power-on as shown in FIG. 22. If the order of power-on is defined, the usability of the semiconductor device will be deteriorated from the user's side.

The level conversion circuit shown in FIG. 22 is used mainly in the following two cases.

The first case is where both of external power supply potentials Ext.Vcc1 and Ext.Vcc2 are used as the operating power supply potentials of the internal circuit, wherein external power supply potential Ext.Vcc1 is higher than power supply potential Ext.Vcc2. In the event of applying a signal from the circuit with Ext.Vcc2 as the operating power supply potential to a circuit with Ext.Vcc1 as the operating power supply potential, the path of the through current in the level conversion circuit must be disconnected. A structure for this purpose must be implemented.

The second case of the level conversion circuit is when a signal is to be delivered from a circuit with Ext.Vcc2 as the operating power supply potential to a circuit with a higher internal power supply potential as the operating power supply potential, wherein this internal power supply potential is generated internally from external power supply potential Ext.Vcc1.

In this case, a level conversion circuit is employed having an internal power supply potential applied instead of power supply potential Ext.Vcc1 in the level conversion circuit of FIG. 22. A structure that disconnects the through current path of the level conversion circuit or a structure that suppresses the generation of the internal power supply potential in the case power supply potential Ext.Vcc2 is not yet high enough must be implemented.

SUMMARY OF THE INVENTION

An object of the present invention is to provide a semiconductor device capable of reducing through current when including an internal circuit using a plurality of power supply potentials.

According to an aspect of the present invention, a semiconductor device includes a first terminal, a second terminal, a sense circuit, and an internal circuit.

The first terminal receives a first power supply potential. The second terminal receives a second power supply potential. The sense circuit receives an operating power supply potential from the first terminal to sense the potential of the second terminal. The internal circuit receives an input signal applied according to the potential of the second terminal to operate according to the output of the sense circuit.

A main advantage of the present invention is that a semiconductor device receiving a plurality of power supply potentials can detect that the power supply potential has not risen and cause the internal circuit to carry out a predetermined operation to reduce through current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
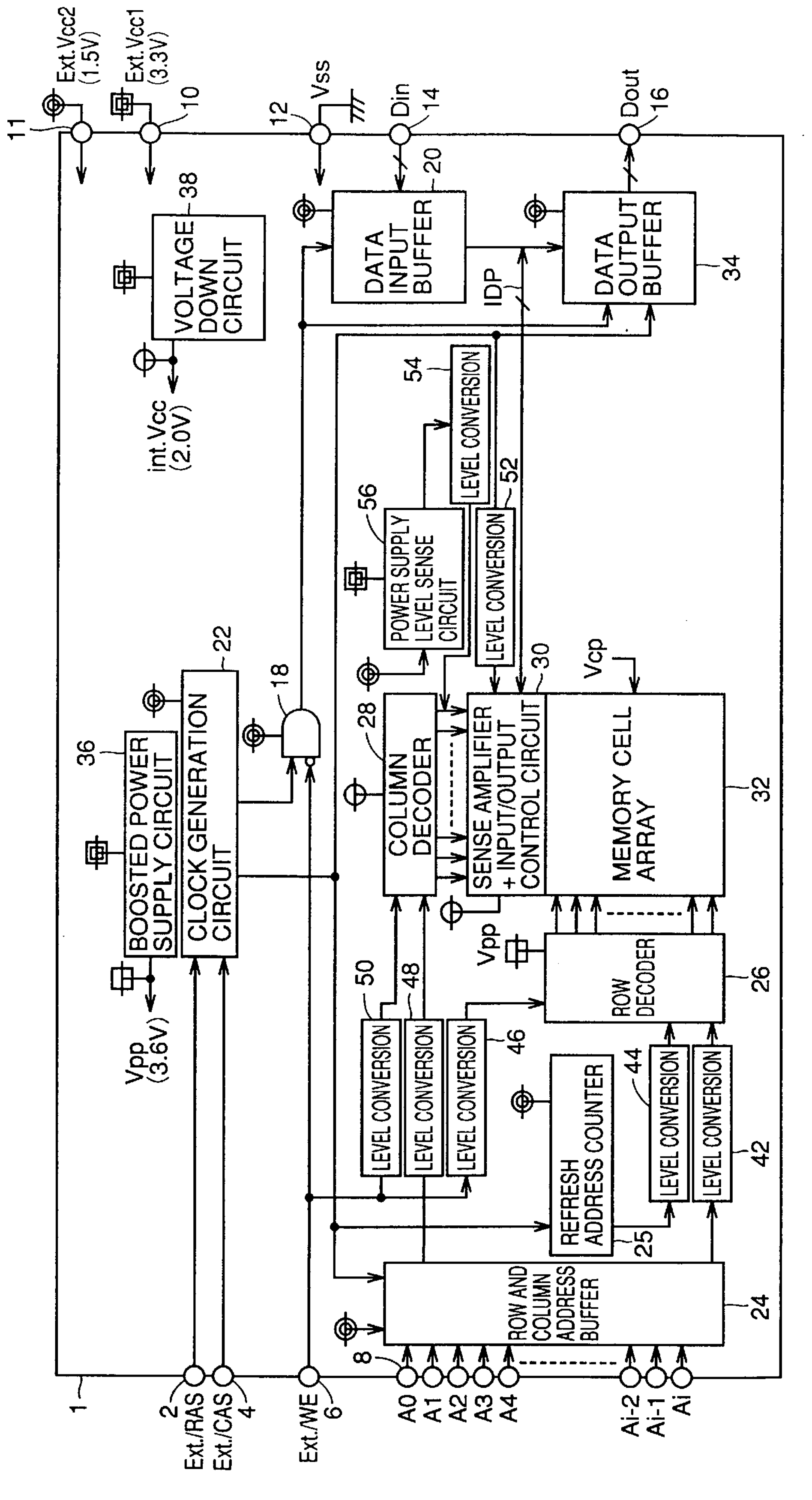
FIG. 1 is a schematic block diagram showing a structure of a semiconductor device 1 according to a first embodiment of the present invention.

Embodiments of the present invention will be described hereinafter with reference to the drawings. In the drawings, the same reference numerals denote the same or corresponding components.

First Embodiment

FIG. 1 is a schematic block diagram showing a structure of a semiconductor device 1 according to a first embodiment of the present invention. A dynamic random access memory (DRAM) receiving a plurality of power supply potentials is taken as an example of a semiconductor device.

Referring to FIG. 1, semiconductor device 1 includes control signal input terminals 2–6 receiving control signals Ext./RAS, Ext./CAS and Ext./WE, respectively, an address input terminal group 8, an input terminal group 14 to which a data signal Din is input, an output terminal group 16 from which a data signal Dout is output, a ground terminal 12 to which ground potential Vss is applied, a power supply terminal 10 to which power supply potential Ext.Vcc1 is applied, and a power supply terminal 11 to which power supply potential Ext.Vcc2 is applied.

Semiconductor device 1 further includes a clock generation circuit 22, a row and column address buffer 24, a refresh address counter 25, a row decoder 26, a column decoder 28, a sense amplifier+input/output control circuit, a memory cell array 32, a gate circuit 18, a data input buffer 20, and a data output buffer 34.

Clock generation circuit 22 generates a control clock corresponding to a predetermined operation mode based on externally applied external row address strobe signal Ext./RAS and external column address strobe signal Ext./CAS via control signal input terminals 2 and 4 to control the operation of the entire semiconductor device.

Row and column address buffer 24 provides an address signal generated based on externally applied address signals A0–Ai (i is natural number) to row decoder 26 and column decoder 28.

Refresh address counter 25 is under control of clock generation circuit 22 to generate and apply to row decoder 26 a refresh address at a predetermined cycle in a refresh mode.

The memory cell in memory cell array 32 specified by row decoder 26 and column decoder 28 has data transferred with respect to an external source through input terminal group 14 or output terminal group 16 via sense amplifier+input/output control circuit 30 and data input buffer 20 or data output buffer 34.

Semiconductor device 1 further includes a boosted voltage power supply circuit 36 boosting power supply potential Ext.Vcc1 to generate an internal boosted potential Vpp, and a voltage down circuit 38 receiving and decreasing power supply potential Ext.Vcc2 to generate an internal power supply potential int.Vcc.

As to each power supply potential, power supply potential Ext.Vcc1 is 3.3 V, power supply potential Ext.Vcc2 is 1.5 V, internal boosted potential Vpp is 3.6 V, and internal power supply potential int.Vcc is 2.0 V, for example.

Gate circuit 18, clock generation circuit 22, data input buffer 20, row and column address buffer 24, refresh address counter 25 and data output buffer 34 receive power supply potential Ext.Vcc2 as the operating power supply potential. Row decoder 26 receives internal boosted potential Vpp as the operating power supply potential. This internal boosted potential corresponds to the activation level of a word line. Column decoder 28, sense amplifier+input/output control circuit 30 receive internal power supply potential int.Vcc as the operating power supply potential.

Semiconductor device 1 further includes a power supply level sense circuit 56 receiving power supply potential Ext.Vcc1 as the operating power supply potential to sense the potential of power supply potential Ext.Vcc2, and level conversion circuits 42–52 converting the level of signals between circuits with different power supply potentials as the operating power supply potential. Level conversion circuit 42 converts the level of the signal received from row and column address buffer 24 to provide the level-converted signal to row decoder 26.

Level conversion circuit 44 receives and converts the level of the signal from refresh address counter 25 to provide the level-converted signal to row decoder 26. Level conversion circuit 48 converts the level of the column address signal from row and column address buffer 24 to provide a level-converted signal to column decoder 28.

Level conversion circuits 46 and 50 receive control signal Ext./WE to convert the level and provides the level-converted signal to row decoder 26 and column decoder 28. Level conversion circuit 52 converted the level of the control signal output from clock generation circuit 22 to provide the level-converted signal to sense amplifier+input/output control circuit 30. Level conversion circuit 54 receives and converts the level of the output of power supply level sense circuit 56 to provide the level-converted signal to the output signal line of column decoder 28.

Semiconductor device 1 of FIG. 1 is merely a typical representative. The present invention is applicable to a synchronous semiconductor device (for example, SDRAM). Furthermore, the present invention is applicable to various semiconductor devices that has a circuit receiving a plurality of power supply potentials.

Figure 2:
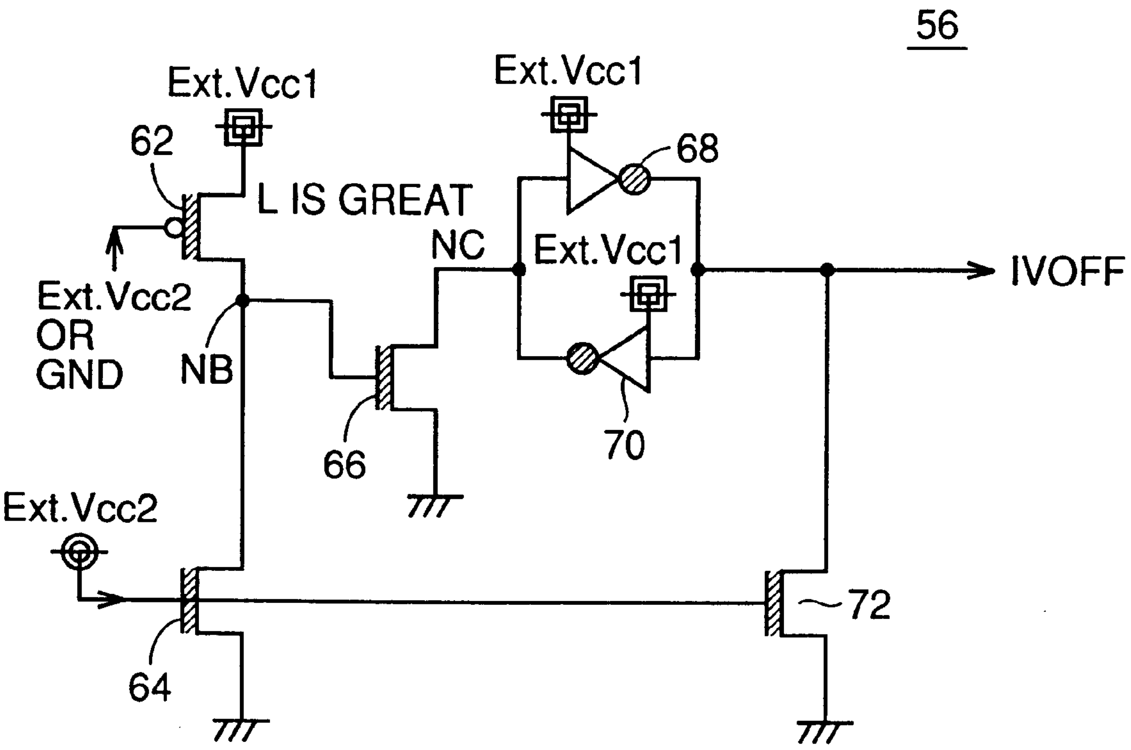
FIG. 2 shows an example of a first structure of a power supply level sense circuit 56 of FIG. 1.

FIG. 2 shows a first structure of power supply level sense circuit 56 of FIG. 1.

Referring to FIG. 2, power supply level sense circuit 56 includes a P channel MOS transistor 62 of a great gate length L receiving ground potential or power supply potential Ext.Vcc2 at its gate, and connected between the node to which power supply potential Ext.Vcc1 is applied and a node NB, an N channel MOS transistor 64 connected between node NB and the ground node, receiving power supply potential Ext.Vcc2 at its gate, an N channel MOS transistor 66 having its gate connected to node NB, and connected between node NC and the ground node, an inverter 68 having an input connected to a node NC, an inverter 70 receiving and inverting the output of inverter 68 to feedback the inverted output to node NC, and an N channel MOS transistor 72 connected between the output of inverter 68 and the ground node, and receiving power supply potential Ext.Vcc2 at its gate.

Inverters 68 and 70 receive power supply potential Ext.Vcc1 as the operating power supply potential. Inverter 68 provides an output of a signal IVOFF. Signal IVOFF attains an H level when externally applied power supply potential Ext.Vcc2 has not yet risen, and an L level when power supply potential Ext.Vcc2 has risen sufficiently.

The transistors and inverters which are the structural components of power supply level sense circuit 56 are all formed of transistors having a gate oxide film of a thickness that can withstand the power supply voltage of Ext.Vcc1.

When power supply potentials Ext.Vcc1 and Ext.Vcc2 are both high enough, through current flows from power supply potential Ext.Vcc1 to the ground node via node NB. A transistor of a great gate length L is selected for P channel MOS transistor 62 to limit the current amount. The value of power supply potential Ext.Vcc2 at the transition of signal IVOFF from an H level to an L level is determined depending upon the balance of the current drivability between inverter 68 and N channel MOS transistor 72.

The usage of power supply level sense circuit 56 allows the semiconductor device to identify whether power supply potential Ext.Vcc2 is applied from an external source or not.

Figure 3:
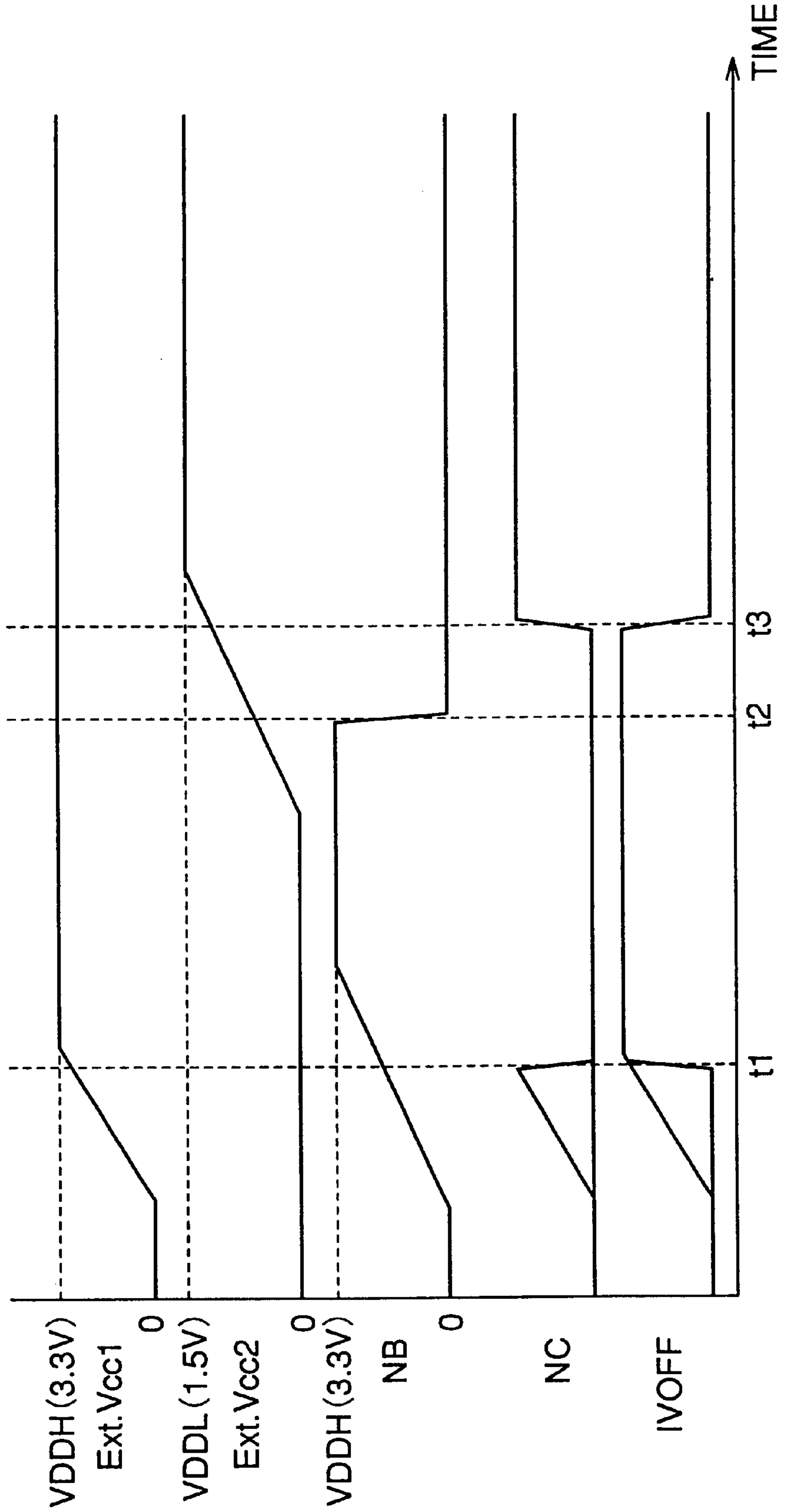
FIG. 3 is an operation waveform diagram to explain an operation of power supply level sense circuit 56 of FIG. 2.

FIG. 3 is an operation waveform diagram to explain the operation of power supply level sense circuit 56 of FIG. 2.

Referring to FIGS. 2 and 3, when power supply potential Ext.Vcc1 rises, the potential of node NB exceeds the threshold voltage of N channel MOS transistor 66 at time t1. Accordingly, the potential of node NC is ascertained at an L level, and signal IVOFF is ascertained at an H level.

At time t2, power supply potential Ext.Vcc2 rises. When the level of power supply potential Ext.Vcc2 exceeds the threshold voltage of N channel MOS transistor 64, the potential of node NB falls to an L level.

At time t3, the level of power supply potential Ext.Vcc2 further rises. When the drivability of N channel MOS transistor 72 overcomes the drivability of inverter 68, the potential of node NC rises from an L level to an H level, and signal IVOFF is pulled down to an L level from an H level.

More specifically, during time t1–t3, power supply level sense circuit 56 senses that external power supply potential Ext.Vcc2 has not yet been applied. From time t3 onward, power supply level sense circuit 56 senses that power supply potential Ext.Vcc2 is applied.

Although not shown in FIG. 1, the output of power supply level sense circuit 56 is also applied to the internal circuit receiving an input signal of an amplitude according to power supply potential Ext.Vcc2. In such an internal circuit, there is an event that the input signal is not yet ascertained and attains an intermediate potential when power supply potential Ext.Vcc2 is not yet high enough. This corresponds to the case where an input signal is generated by a circuit with power supply potential Ext.Vcc2 as the operating power supply potential inside and outside the chip.

For example, this input signal is a signal Ext./WE, when applied, from a semiconductor device with power supply potential Ext.Vcc2 as the operating power supply potential on a printed circuit board where another semiconductor device is mounted. Also, the input signal is a signal applied from row and column address buffer 24 that receives power supply potential Ext.Vcc2 as the operating power supply potential in the chip.

An internal circuit receiving such input signals often has a level conversion circuit provided at the portion receiving the input signal. For example, column decoder 28 and level conversion circuits 48 and 50 correspond to this internal circuit in FIG. 1.

Thus, a sense signal can be generated from power supply level sense circuit 56 that can be used to control the through current generated at a circuit that receives, when any of a plurality of external power supply potentials is not applied, the applied external power supply potential as the power supply potential.

[Modification of First Embodiment]

In the voltage level sense circuit of FIG. 2, a transistor 62 of a great gate length L is used to restrict the steady current flowing when power supply potentials Ext.Vcc1 and Ext.Vcc2 have both risen. The steady current can be restricted in another manner. For example, the usage of an internal potential of a reference potential generation circuit generally incorporated in a DRAM can be considered.

Figure 4:
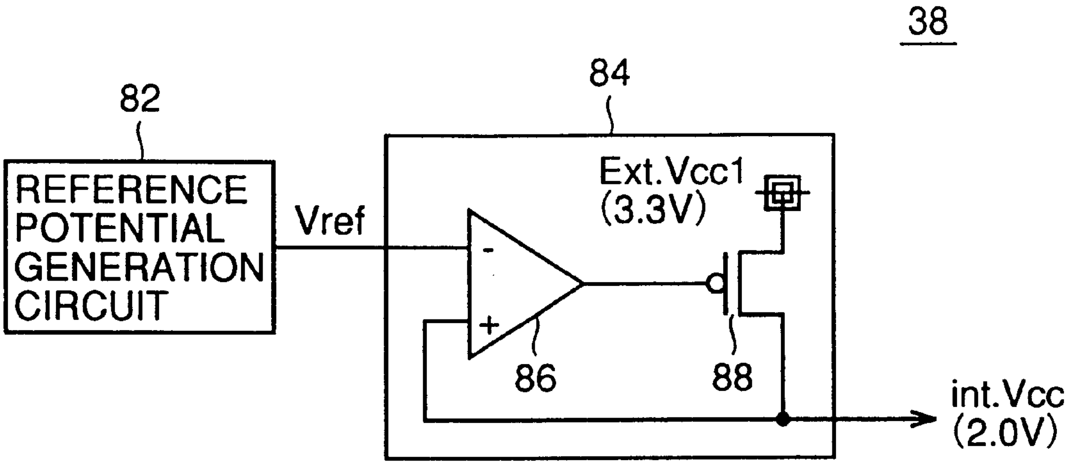
FIG. 4 is a block diagram showing a structure of a voltage drop circuit 38 of FIG. 1.

FIG. 4 is a block diagram showing a structure of voltage drop circuit 38 of FIG. 1. Referring to FIG. 4, voltage drop circuit 38 includes a reference potential generation circuit 82 generating a reference potential Vref which becomes the reference of internal power supply potential int.Vcc, and a voltage conversion unit 84 receiving reference potential Vref to output internal power supply potential int.Vcc.

Voltage conversion unit 84 includes a differential amplifier 86 receiving and comparing reference potential Vref and internal power supply potential int.Vcc, and a P channel MOS transistor 88 receiving the output of differential amplifier 86 at its gate, and connected between the power supply node receiving external power supply potential Ext.Vcc1 and the output node providing internal power supply potential int.Vcc.

Figure 5:
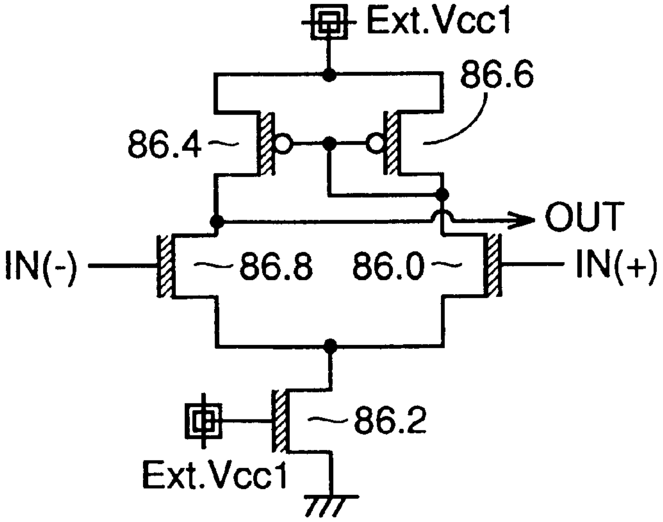
FIG. 5 is a circuit diagram showing an example of a structure of a differential amplifier 86 of FIG. 4.

FIG. 5 is a circuit diagram showing an example of a structure of differential amplifier 86 of FIG. 4.

Referring to FIG. 5, differential amplifier 86 includes an N channel MOS transistor 86.2 receiving external power supply potential Ext.Vcc1 at its gate and having its source connected to the ground node, an N channel MOS transistor 86.8 receiving an input signal IN (−) at its gate, and having its source connected to the drain of N channel MOS transistor 86.2, a P channel MOS transistor 86.4 connected between the node to which power supply potential Ext.Vcc1 is applied and the drain of N channel MOS transistor 86.8, a P channel MOS transistor 86.6 having its source connected to power supply potential Ext.Vcc1, and its gate and drain connected to the gate of P channel MOS transistor 86.4, and an N channel MOS transistor 86.0 receiving input signal IN (−) at its gate, and connected between the drain of P channel MOS transistor 86.6 and the drain of N channel MOS transistor 86.2.

Output signal OUT is provided from the drain of N channel MOS transistor 86.8.

Figure 6:
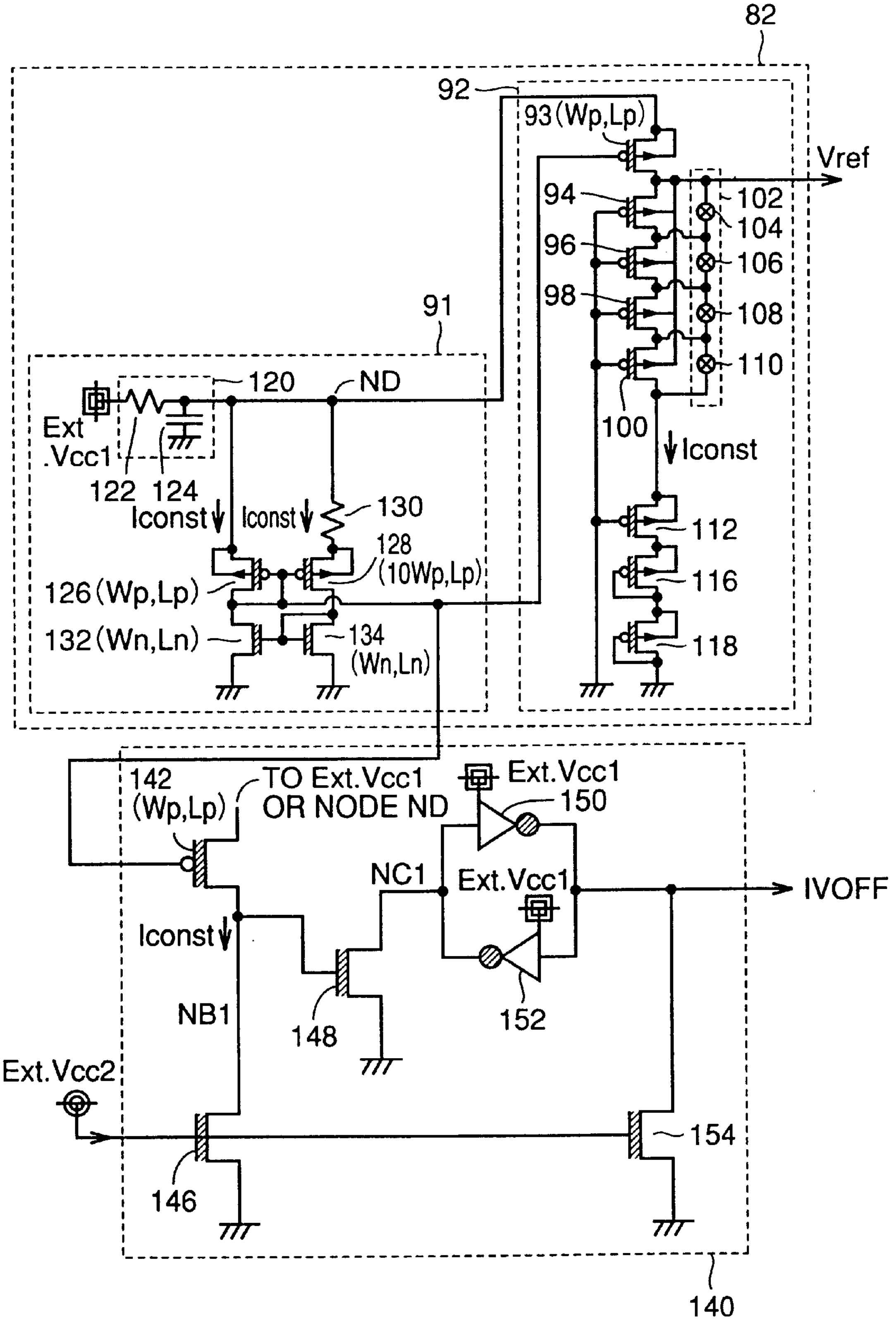
FIG. 6 is a circuit diagram showing a structure of a power supply level sense circuit 140 which is a first modification of the first embodiment and a structure of a reference potential generation circuit 82 of FIG. 4.

FIG. 6 is a circuit diagram showing a structure of power supply level sense circuit 140 which is the first modification of the first embodiment and a structure of reference potential generation circuit 82 of FIG. 4.

Referring to FIG. 6, reference potential generation circuit 82 includes a constant current generation circuit 91, and an output circuit 92 providing a reference potential Vref according to the output of constant current generation circuit 91.

Constant current generation circuit 91 includes a low pass filter 120 connected between power supply potential Ext.Vcc1 and node ND. Low pass filter 120 includes a resistor 122 connected between the node receiving power supply potential Ext.Vcc1 and node ND, and a capacitor 124 connected between node ND and the ground node.

Constant current generation circuit 91 further includes a P channel MOS transistor 126 having a drain and a back gate connected to node ND, and its gate connected to the drain, an N channel MOS transistor 132 connected between the drain of P channel MOS transistor 126 and the ground node, an N channel MOS transistor 134 having its source connected to the ground node, and its gate and drain connected to the gate of N channel MOS transistor 132, a P channel MOS transistor 128 having its drain connected to the drain of N channel MOS transistor 134 and its gate connected to the drain of P channel MOS transistor 126, and a resistor 130 having one end connected to the source and back gate of P channel MOS transistor 128 and the other end connected to node ND.

N channel MOS transistors 132 and 134 both have the same gate width and gate length of Wn and Ln, respectively. Assuming that the gate width and gate length of P channel MOS transistor 126 is Wp and Lp, respectively, P channel MOS transistor 128 has a gate width and gate length of 10 Wp and Lp, respectively.

By such a structure, a constant current Iconst relatively immune to the change in power supply voltage (Ext.Vcc1) is conducted to both P channel MOS transistor 126 and P channel MOS transistor 128.

Output circuit 92 includes a P channel MOS transistor 93 having its source and back gate connected to node ND, and its gate connected to the drain of P channel MOS transistor 126, P channel MOS transistors 94, 96, 98, 100, 112, 116 and 118 connected in series between the drain of P channel MOS transistor 93 and the ground node, and a tuning circuit 102 to tune reference potential Vref P channel MOS transistors 94–100 have their gates connected to the ground node, and their back gates connected to the drain of P channel MOS transistor 93. P channel MOS transistor 112 has its own source and back gate coupled, and its gate connected to the ground node. P channel MOS transistor 116 has its own source and back gate connected, and its gate connected to its own drain. P channel MOS transistor 118 has its own source and back gate connected, and its gate connected to the ground node.

Tuning circuit 102 includes a fuse 104 connected between the drain of P channel MOS transistor 93 and the drain of P channel MOS transistor 94, a fuse 106 connected between the drain of P channel MOS transistor 94 and the drain of P channel MOS transistor 96, a fuse 108 connected between the drain of P channel MOS transistor 96 and the drain of P channel MOS transistor 98, and a fuse 110 connected between the drain of P channel MOS transistor 98 and the drain of P channel MOS transistor 100.

By selectively blowing out fuses 104–110, the level of reference potential Vref output from the drain of P channel MOS transistor 93 can be adjusted.

Power supply level sense circuit 140 includes a P channel MOS transistor 142 having a gate width and gate length equal to those of P channel MOS transistor 126. P channel MOS transistor 142 has its source connected to power supply potential Ext.Vcc1 or node ND. P channel MOS transistor 142 has its gate connected to the drain of P channel MOS transistor 126, and its drain connected to node NB1.

Power supply level sense circuit 140 further includes an N channel MOS transistor 146 receiving external power supply potential Ext.Vcc2 at its gate, and connected between node NB1 and the ground node, an N channel MOS transistor 148 having its gate connected to node NB1, and connected between node NC1 and the ground node, an inverter 150 connected to the input of node NC1, an inverter 152 inverting the output of inverter 150 to feedback the inverted output to node NC1, and an N channel MOS transistor 154 connected between the output of inverter 150 and the ground node, and receiving external power supply potential Ext.Vcc2 at its gate.

Inverters 150 and 152 receive power supply potential Ext.Vcc1 as the operating power supply potential to operate. Signal IVOFF is output from inverter 150.

By the above-described structure, a power supply level sense circuit can be implemented without using a P channel MOS transistor 62 of a great gate length.

Figure 7:
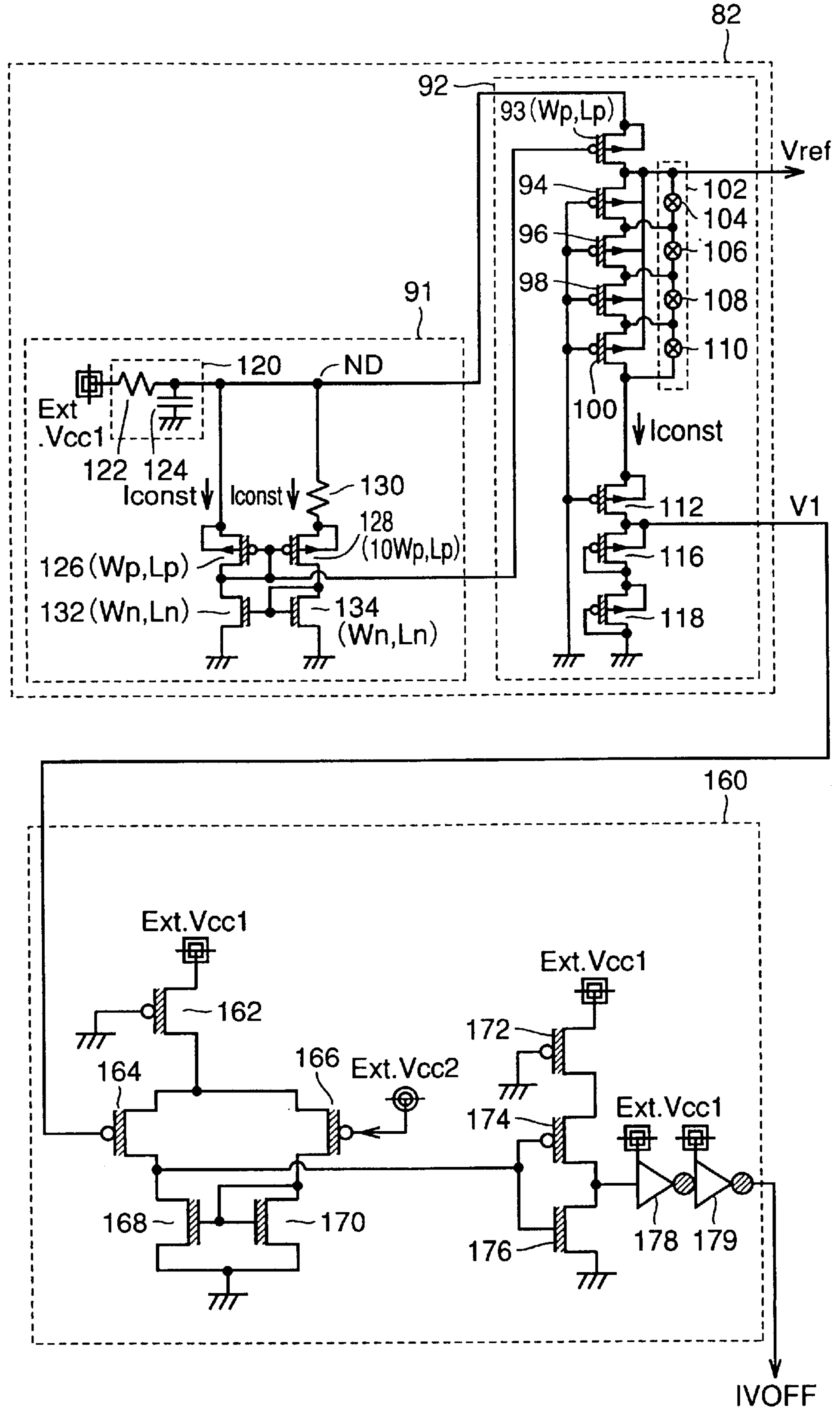
FIGS. 7, 8, 9 and 10 are circuit diagrams showing a second, third, fourth, and fifth modification, respectively, of a power supply level sense circuit.

FIG. 7 is a circuit diagram showing a structure of a second modification of the power supply level sense circuit.

Referring to FIG. 7, a power supply level sense circuit 160 receives a potential V1 which is the internal potential of the output portion of reference potential generation circuit 82. The potential of the drain of P channel MOS transistor 112, for example, can be used for potential V1.

Power supply level sense circuit 160 includes a P channel MOS transistor 162 having its source coupled to external power supply potential Ext.Vcc1 and its gate connected to the ground node, a P channel MOS transistor 164 receiving potential V1 at its gate, and having its source connected to the drain of P channel MOS transistor 162, a P channel MOS transistor 166 receiving external power supply potential Ext.Vcc2 at its gate, and having its source connected to the drain of P channel MOS transistor 162, an N channel MOS transistor 168 connected between the drain of P channel MOS transistor 164 and the ground node, and having its gate connected to the drain of P channel MOS transistor 166, and an N channel MOS transistor 170 having its gate and drain connected to the drain of P channel MOS transistor 166, and its source connected to the ground node.

Power supply level sense circuit 160 further includes a P channel MOS transistor 172 having its source coupled to external power supply potential Ext.Vcc1 and its gate connected to the ground node, a P channel MOS transistor 174 having its gate connected to the drain of P channel MOS transistor 164 and its source connected to the drain of P channel MOS transistor 172, an N channel MOS transistor 176 having its gate connected to the drain of P channel MOS transistor 164, and connected between the drain of P channel MOS transistor 174 and the ground node, an inverter 178 having its input connected to the drain of N channel MOS transistor 176, and an inverter 179 receiving and inverting the output of inverter 178 to output signal IVOFF.

P channel MOS transistors 162 and 172 both serve to restrict the current, and have a large gate length L. Inverters 178 and 179 receive power supply potential Ext.Vcc1 as the operating power supply potential to operate.

According to such a structure, power supply level sense circuit 160 compares intermediate potential V1 with external power supply potential Ext.Vcc2 to output signal IVOFF of an H level when external power supply potential Ext.Vcc2 is off and an L level when external power supply potential Ext.Vcc2 is on.

Figure 8:
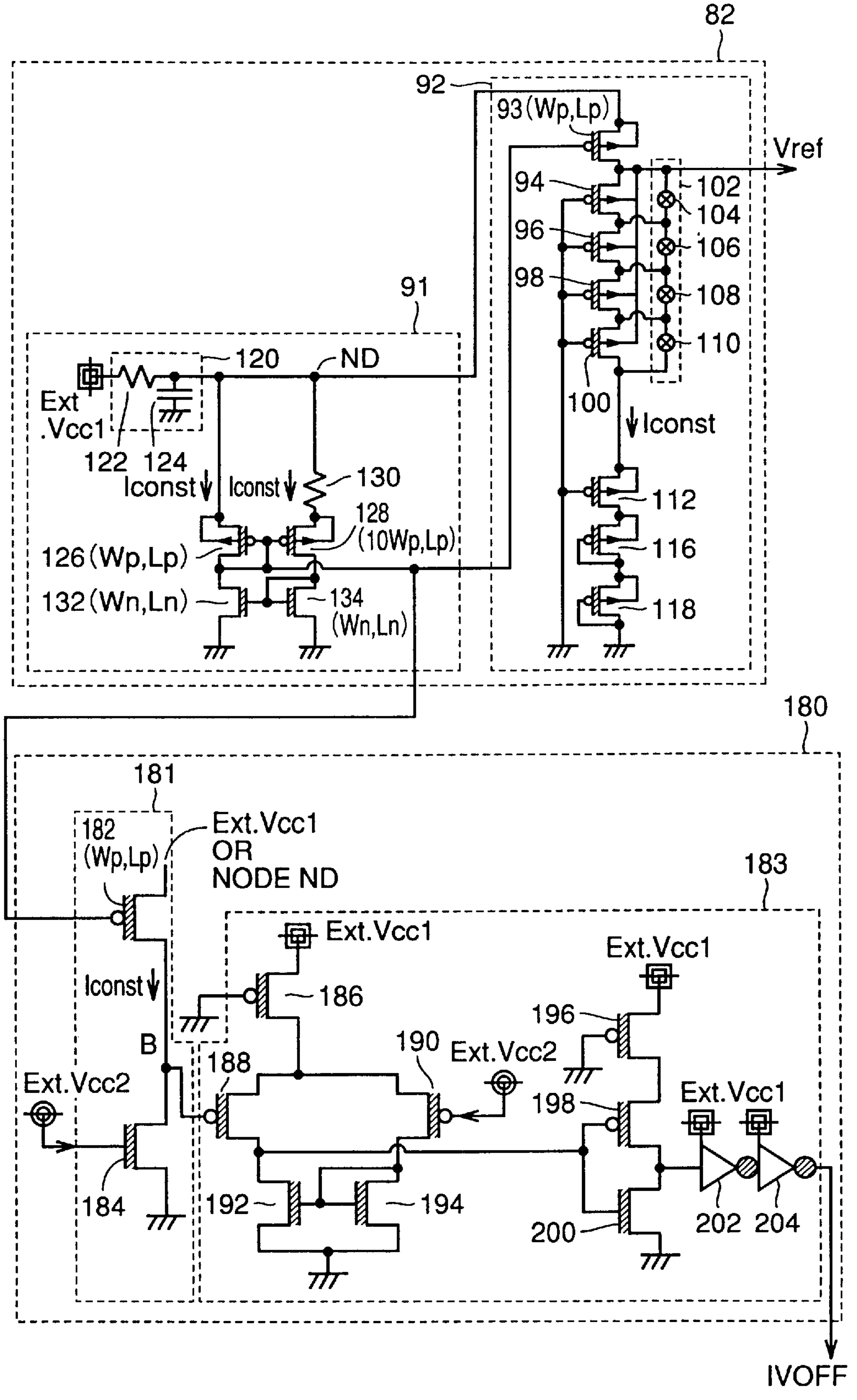

FIG. 8 is a circuit diagram showing a third modification of a power supply level sense circuit.

Referring to FIG. 8, a power supply level sense circuit 180 receives the potential of the drain of P channel MOS transistor 126 in reference potential generation circuit 82. Power supply level sense circuit 180 includes a potential generation unit 181 generating a potential to determine the on/off status of external power supply potential Ext.Vcc2, and a potential comparison unit 183 comparing the output of potential generation unit 181 with external power supply potential Ext.Vcc2 to output signal IVOFF.

Potential generation unit 181 includes a P channel MOS transistor 182 having its source connected to power supply potential Ext.Vcc1 or node ND, and its gate receiving the potential of the drain of P channel MOS transistor 126, and an N channel MOS transistor 184 connected between the drain of P channel MOS transistor 182 and the ground node, and receiving power supply potential Ext.Vcc2 at its gate.

P channel MOS transistor 182 has its gate width and gate length set to values equal to those of P channel MOS transistor 126.

Potential comparison unit 183 includes a P channel MOS transistor 186 having its source connected to external power supply potential Ext.Vcc1 and its gate connected to the ground node, a P channel MOS transistor 188 having its source connected to the drain of P channel MOS transistor 186 and receiving the potential of the drain of N channel MOS transistor 184 at its gate, a P channel MOS transistor 190 having its source connected to the drain of P channel MOS transistor 186, and receiving external power supply potential Ext.Vcc2 at its gate, an N channel MOS transistor 192 connected between the drain of P channel MOS transistor 188 and the ground node, and receiving the potential of the drain of P channel MOS transistor 190 at its gate, and an N channel MOS transistor 194 having its drain and gate connected to the drain of P channel MOS transistor 190 and its source connected to the ground node.

Potential comparison unit 183 further includes a P channel MOS transistor 196 having its source coupled to external power supply potential Ext.Vcc1, and its gate connected to the ground node, a P channel MOS transistor 198 having its gate connected to the drain of N channel MOS transistor 192 and its source connected to the drain of P channel MOS transistor 196, an N channel MOS transistor 200 having its gate connected to the drain of N channel MOS transistor 192, and connected between the drain of P channel MOS transistor 198 and the ground node, an inverter 202 having its input connected to the drain of N channel MOS transistor 200, and an inverter 204 receiving and inverting the output of inverter 202 to provide signal IVOFF.

Inverters 202 and 204 receive external power supply potential Ext.Vcc1 as the operating power supply potential to operate.

The above-described structure allows generation of a signal IVOFF that attains an H level and an L level when external power supply potential Ext.Vcc2 is off and on, respectively.

Figure 9:
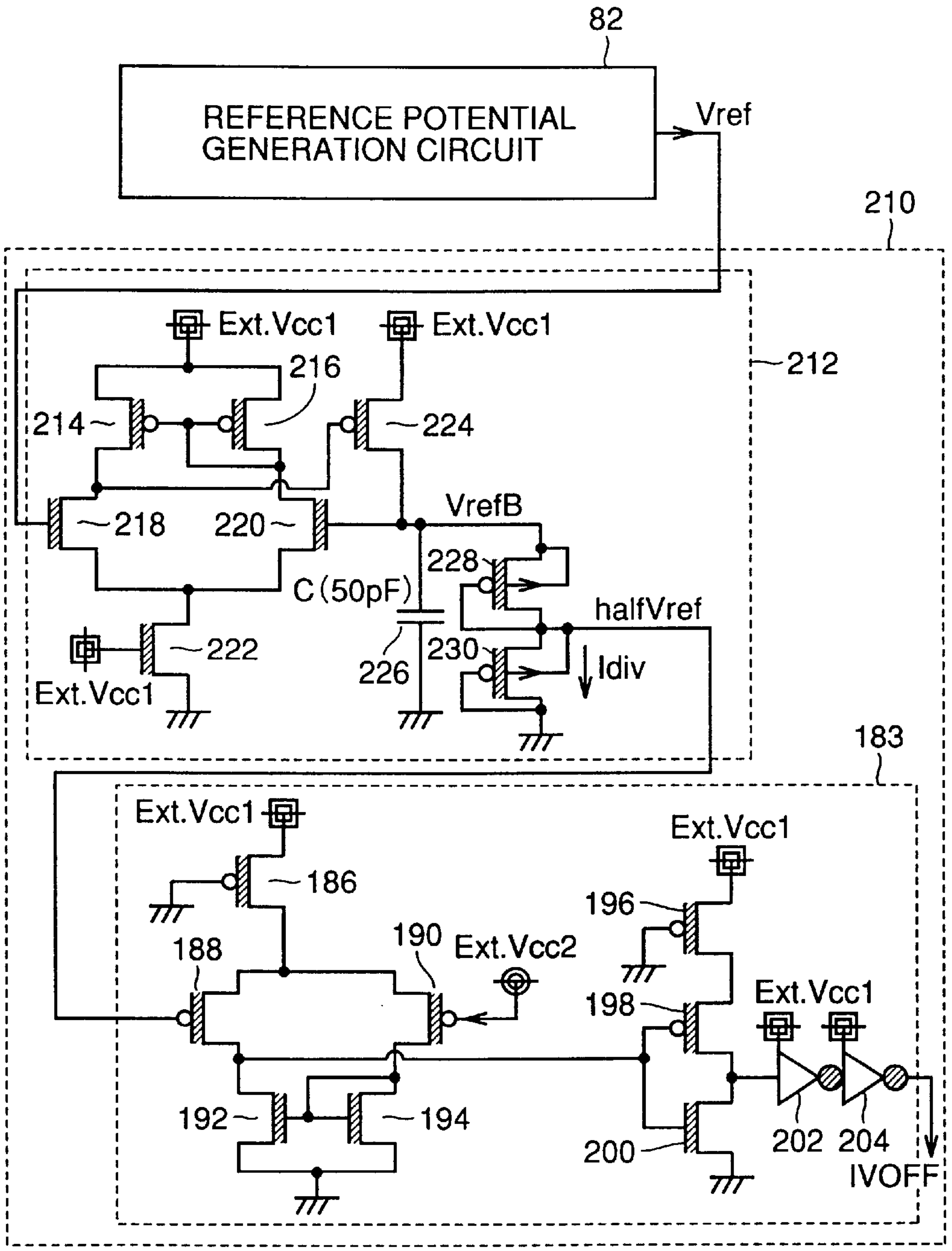

FIG. 9 is a circuit diagram showing a fourth modification of a power supply level sense circuit.

Referring to FIG. 9, a power supply level sense circuit 210 includes a potential generation unit 212 receiving reference potential Vref output from reference potential generation circuit 82 to output a potential halfVref, and a potential comparison unit 138 comparing potential halfVref with external power supply potential Ext.Vcc2 to output a signal IVOFF.

Potential generation unit 212 includes an N channel MOS transistor 222 receiving external power supply potential Ext.Vcc1 at its gate, and having its source connected to the ground node, an N channel MOS transistor 218 receiving reference potential Vref at its gate, and having its source connected to the drain of N channel MOS transistor 222, a P channel MOS transistor 214 connected between the node to which power supply potential Ext.Vcc1 is applied and the drain of N channel MOS transistor 218, a P channel MOS transistor 216 having its source coupled to power supply potential Ext.Vcc1, and having its gate and drain connected to the gate of P channel MOS transistor 214, and an N channel MOS transistor 220 connected between the drain of P channel MOS transistor 216 and the drain of N channel MOS transistor 222.

Potential generation unit 212 further includes a P channel MOS transistor 224 having its source coupled to external power supply potential Ext.Vcc1 and its gate connected to the drain of P channel MOS transistor 214, and its drain connected to the gate of N channel MOS transistor 220, a capacitor 226 connected between the gate of N channel MOS transistor 220 and the ground node, and P channel MOS transistors 228 and 230 connected in series between the drain of P channel MOS transistor 224 and the ground node.

It is desirable that the capacitance of capacitor 226 is set to approximately 50 pF, for example.

P channel MOS transistor 228 has its back gate connected to its own source, and its gate connected to its own drain. P channel MOS transistor 230 has its back gate connected to its own source, and its gate connected to the ground node. P channel MOS transistors 228 and 230 are transistors having the same gate width and gate length.

When the potential of the source of P channel MOS transistor 228 is VrefB, the potential of the source of P channel MOS transistor 230 corresponds to potential halfVref which is half the potential thereof.

Potential comparison unit 183 compares potential halfVref with external power supply potential Ext.Vcc2 to output signal IVOFF. The structure thereof is similar to that described with reference to FIG. 8. Therefore, description thereof will not be repeated.

Intermediate potential V1 shown in FIG. 7 is susceptible to the change in external power supply potential Ext.Vcc1 and the temperature. In contrast, reference potential Vref generated by the existing reference potential generation circuit 82 is relatively immune to change in the temperature and power supply potential. Therefore, a voltage divider node which is half the existing reference potential Vref is employed in power supply level sense circuit 210 of FIG. 9. Since the existing reference potential Vref has low dependence on the temperature and power supply voltage, variation in the voltage divider node itself is also small. Therefore, stable determination is possible.

By the structure shown in FIG. 9, control of a finer level can be realized.

Figure 10:
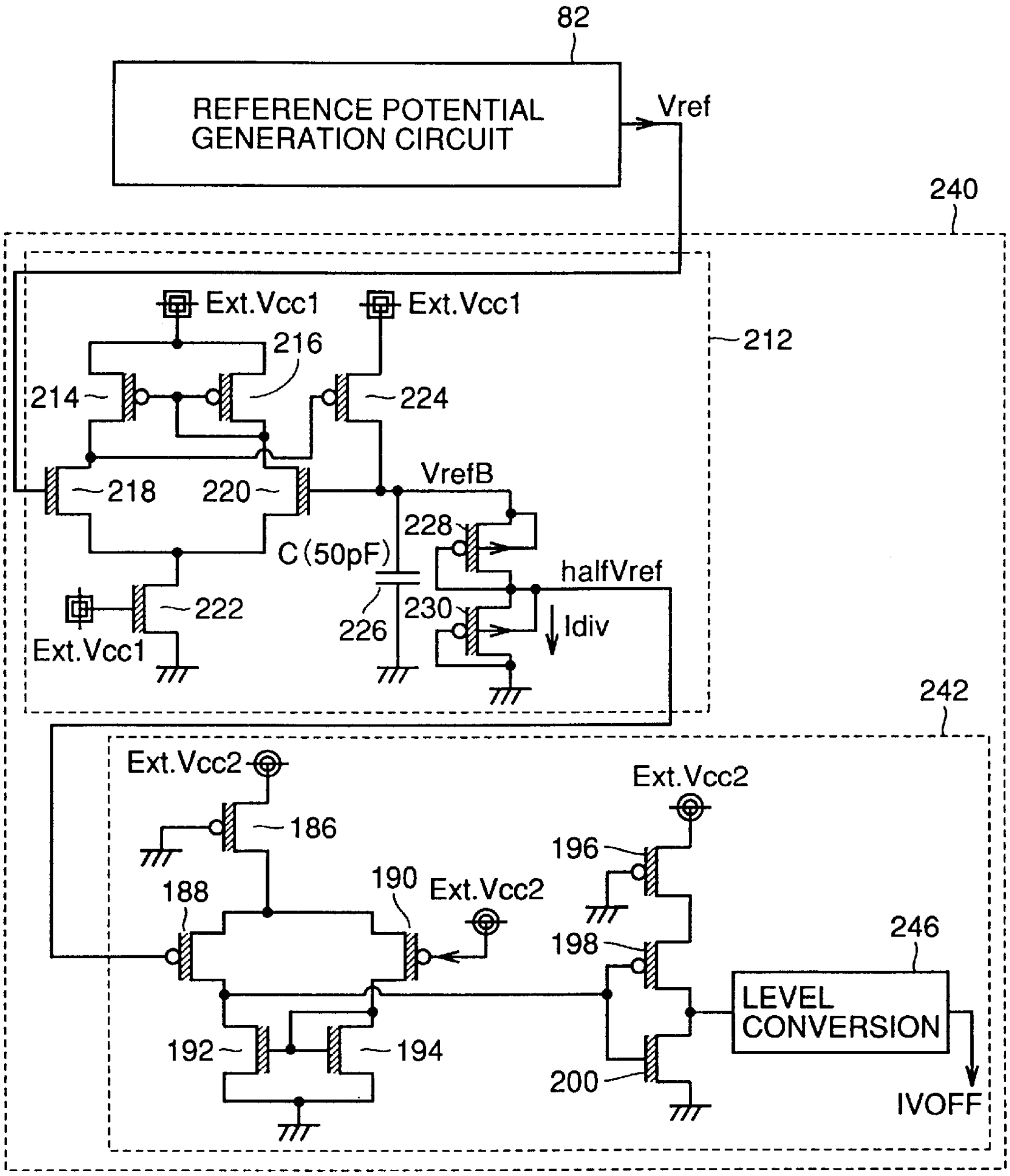

FIG. 10 is a circuit diagram showing a fifth modification of a power supply level sense circuit.

Referring to FIG. 10, a power supply level sense circuit 240 differs in structure from power supply level sense circuit 210 of FIG. 9 in that a potential comparison unit 242 is provided instead of potential comparison unit 183.

Potential comparison unit 242 differs in structure from potential comparison unit 183 of FIG. 9 in that P channel MOS transistor 186 has its source coupled to external power supply potential Ext.Vcc2, P channel MOS transistor 196 has its source coupled to external power supply potential Ext.Vcc2, and a level conversion circuit 246 is provided instead of inverters 202 and 204.

Figure 22:
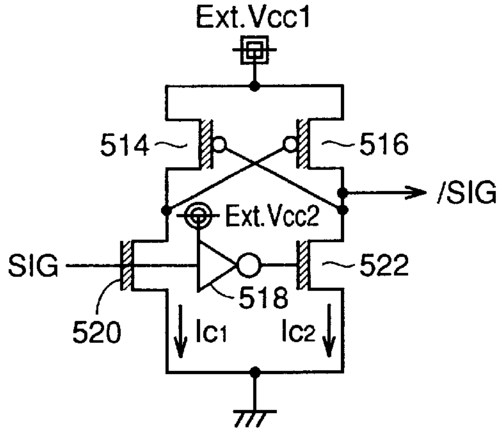
FIG.22 PRIOR ART
FIG. 22 is a circuit diagram showing a structure of a first conventional level conversion circuit converting an H level signal from a low potential to a high potential.

Level conversion circuit 286 has the structure shown in FIG. 22 and functions to convert the level of a signal having a small amplitude to a signal of a large amplitude.

The remaining structure of power supply level sense circuit 240 is similar to that of power supply level sense circuit 210 of FIG. 9. Therefore, description thereof will not be repeated.

Second Embodiment

A second embodiment of the present invention is directed to control an internal power supply generation circuit using the signal output from the power supply level sense circuit described in the first embodiment. By suppressing the operation of the internal power supply generation circuit using the output signal of the power supply level sense circuit, the through current in the circuit that receives the internal power supply potential as the operating power supply potential to operate can be reduced.

Figure 11:
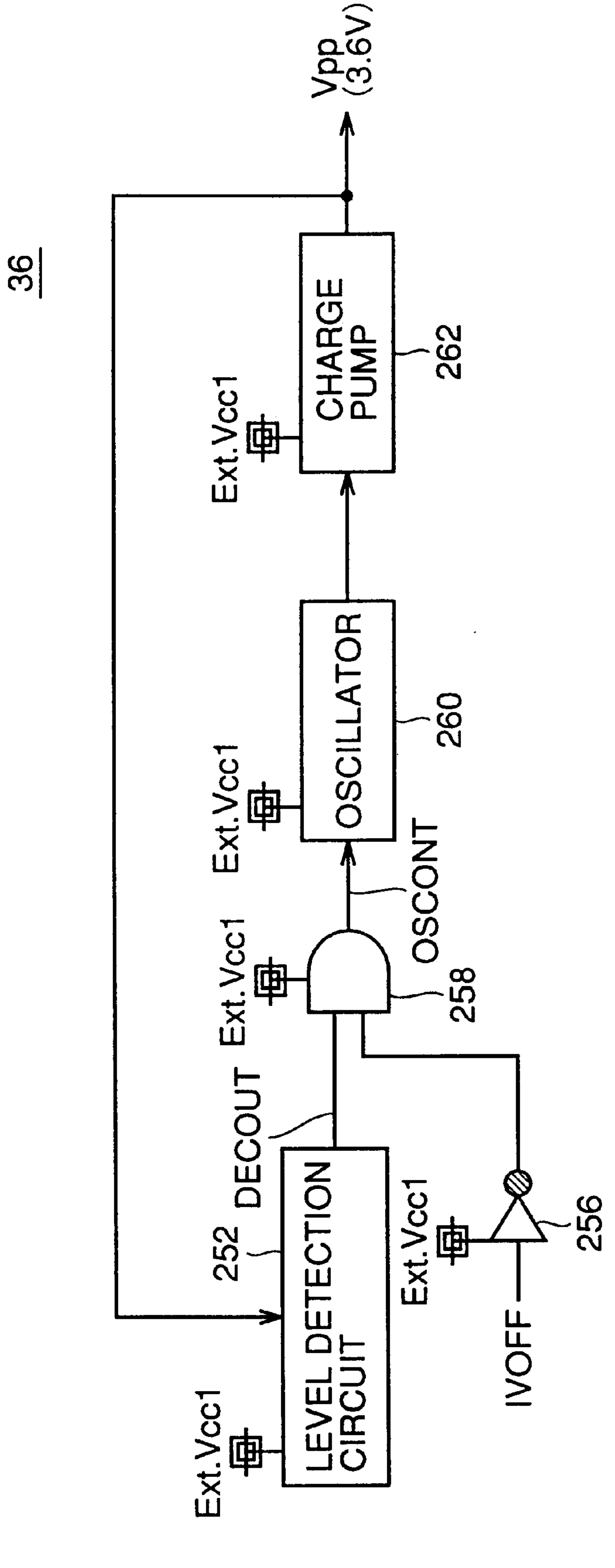
FIG. 11 is a circuit diagram showing a structure of a boosted power supply circuit 36 of FIG. 1.

FIG. 11 is a circuit diagram showing a structure of a boosted voltage power supply circuit 36 of FIG. 1.

Referring to FIG. 11, boosted voltage power supply circuit 36 includes a level detection circuit 252 detecting the level of internal boosted potential Vpp to output a control signal DECOUT according to whether internal boosted potential Vpp is boosted sufficiently or not, an inverter 256 receiving and inverting signal IVOFF generated at any of the circuits of the first embodiment and modifications thereof, an AND circuit 258 receiving control signal DECOUT and the output of inverter 256 to output an oscillator control signal OSCONT, an oscillator 260 initiating oscillation when oscillator control signal OSCONT is rendered active, and a charge pump 262 carrying out a boosting operation according to the clock signal from oscillator 260 to output a boosted potential Vpp.

Figure 21:
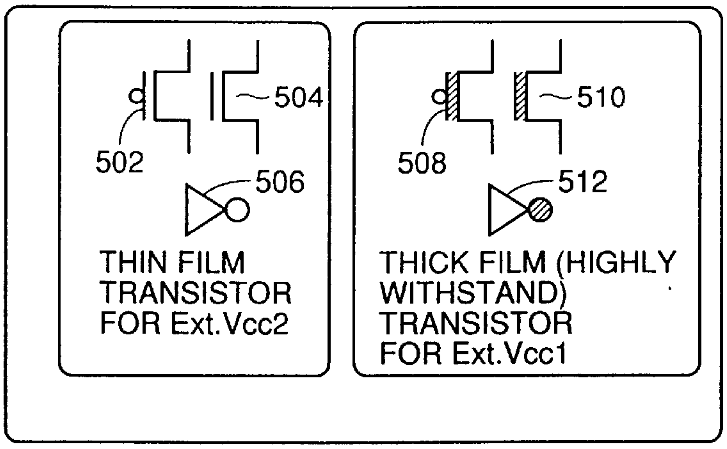
FIG.21 PRIOR ART
FIG. 21 is a diagram to explain symbols used in the present specification.

Level detection circuit 252, inverter 256, AND circuit 258, oscillator 260 and charge pump 262 all receive external power supply potential Ext.Vcc1 as the operating power supply potential. These circuits are formed of transistors having a gate oxide film of a thickness that can withstand the power supply voltage of Ext.Vcc1, as described with reference to FIG. 21.

When internal boosted potential Vpp has not arrived at a predetermined potential, level detection circuit 252 renders control signal DECOUT active to an H level. When internal boosted potential Vpp is high enough, level detection circuit 252 renders control signal DECOUT inactive at an L level.

When a general boosted power supply circuit is applied, oscillator 260 operates whereby boosted potential Vpp is generated by charge pump 262 if external power supply potential Ext.Vcc1 is applied from an external source.

Figure 23:
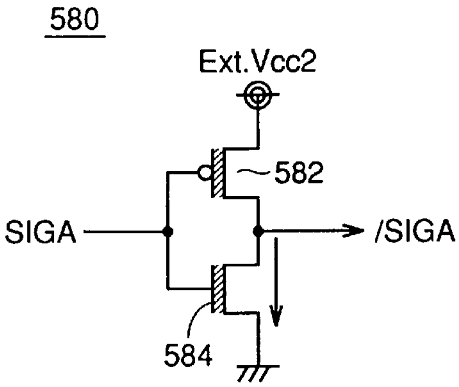
FIG.23 PRIOR ART
FIG. 23 is a circuit diagram showing a structure of a second conventional level conversion circuit converting an H level signal from a high potential to a low potential.

However, in the case where the conventional level conversion circuit shown in FIGS. 22 and 23 is directly employed for level conversion circuits 42, 44, 46, 48, 50, 52 and 54 shown in FIG. 1 or for level conversion circuits 42, 44, 46, 454, and 452 of FIG. 20 that will be described afterwards, through current will flow when boosted potential Vpp attains a high level if external power supply potential Ext.Vcc2 is not high enough.

By employing the structure shown in FIG. 11, boosted potential Vpp will not attain a high level since the oscillation of oscillator 260 is suppressed and the operation of charge pump 262 remains suppressed by virtue of signal IVOFF when external power supply potential Ext.Vcc2 is not high enough. Thus, the flow of through current in the level conversion circuit can be suppressed.

Third Embodiment

A third embodiment of the present invention is directed to application of control by signal IVOFF to voltage down circuit 38 of FIG. 1.

Figure 12:
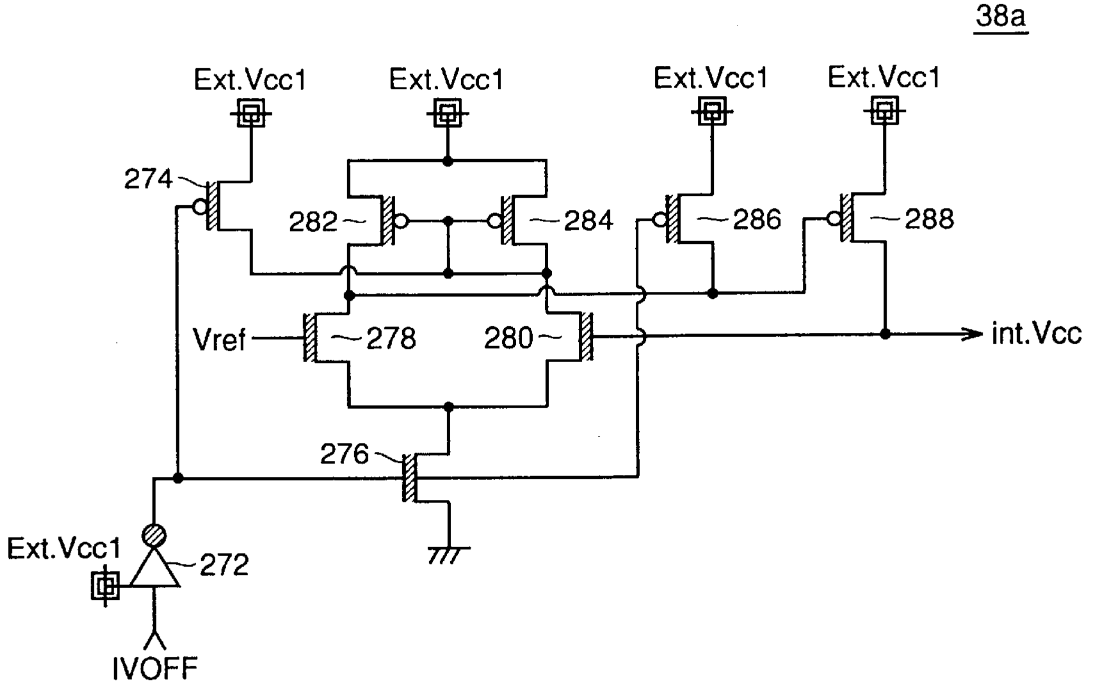
FIG. 12 is a circuit diagram showing a structure of a voltage down circuit 38*a*.

FIG. 12 is a circuit diagram showing a structure of a voltage down circuit 38*a*.

Referring to FIG. 12, voltage down circuit 38 includes an inverter 272 receiving and inverting signal IVOFF, an N channel MOS transistor 276 receiving output of inverter 272 at its gate, and having its source connected to the ground node, an N channel MOS transistor 278 receiving reference potential Vref at its gate, and having its source connected to the drain of N channel MOS transistor 276, an N channel MOS transistor 280 receiving internal power supply potential int.Vcc at its gate, and having its source connected to the drain of N channel MOS transistor 276, a P channel MOS transistor 274 receiving the output of inverter 272 at its gate, having its source connected to external power supply potential Ext.Vcc1 and its drain connected to the drain of N channel MOS transistor 280, and a P channel MOS transistor 286 receiving the output of inverter 272 at its gate, having its source connected to the node receiving external power supply potential Ext.Vcc1, and its drain connected to the drain of N channel MOS transistor 278.

Voltage down circuit 38*a* further includes a P channel MOS transistor 282 connected between the node to which external power supply potential Ext.Vcc1 is applied and the drain of N channel MOS transistor 278, and having its gate connected to the drain of N channel MOS transistor 280, a P channel MOS transistor 284 connected between the node to which external power supply potential Ext.Vcc1 is applied and the drain of N channel MOS transistor 280, and having its gate connected to the drain of N channel MOS transistor 280, and a P channel MOS transistor 288 connected between the node to which external power supply potential Ext.Vcc1 is applied and the gate of N channel MOS transistor 280, and having its gate connected to the drain of N channel MOS transistor 278.

The circuit generating reference potential Vref has a structure similar to that of reference potential generation circuit 82 of FIG. 6 not shown. Therefore, description thereof will not be repeated.

By the above-described circuit configuration, when external power supply potential Ext.Vcc2 has not yet risen even if external power supply potential Ext.Vcc1 has become higher than a predetermined value, P channel MOS transistors 274 and 286 are rendered conductive and N channel MOS transistor 276 is rendered nonconductive. In response, the gate potential attains the level of external power supply potential Ext.Vcc1, so that P channel MOS transistor 288 which is the driver transistor is rendered non conductive. Therefore, current is not supplied to the node from which internal power supply potential int.Vcc is output.

In other words, internal power supply potential int.Vcc does not rise. Therefore, through current can be reduced in a level conversion circuit that converts the level of the signal transmitted from circuitry with external power supply potential Ext.Vcc2 as the operating power supply potential to circuitry with internal power supply potential int.Vcc as the operating power supply potential such as level conversion circuit 48 of FIG. 1.

Fourth Embodiment

A cell plate potential Vcp is applied to one of the electrodes of the capacitor of the memory cell array in the DRAM. This cell plate potential Vcp is often set to approximately ½ the H level. and L level of the write data. Since the maximum voltage applied across the capacitor is greater than the case where cell plate potential Vcp is set to the ground potential, the thickness of the insulation film of the capacitor can be reduced while maintaining the reliability. The capacitance of the capacitor can be increased.

Figure 13:
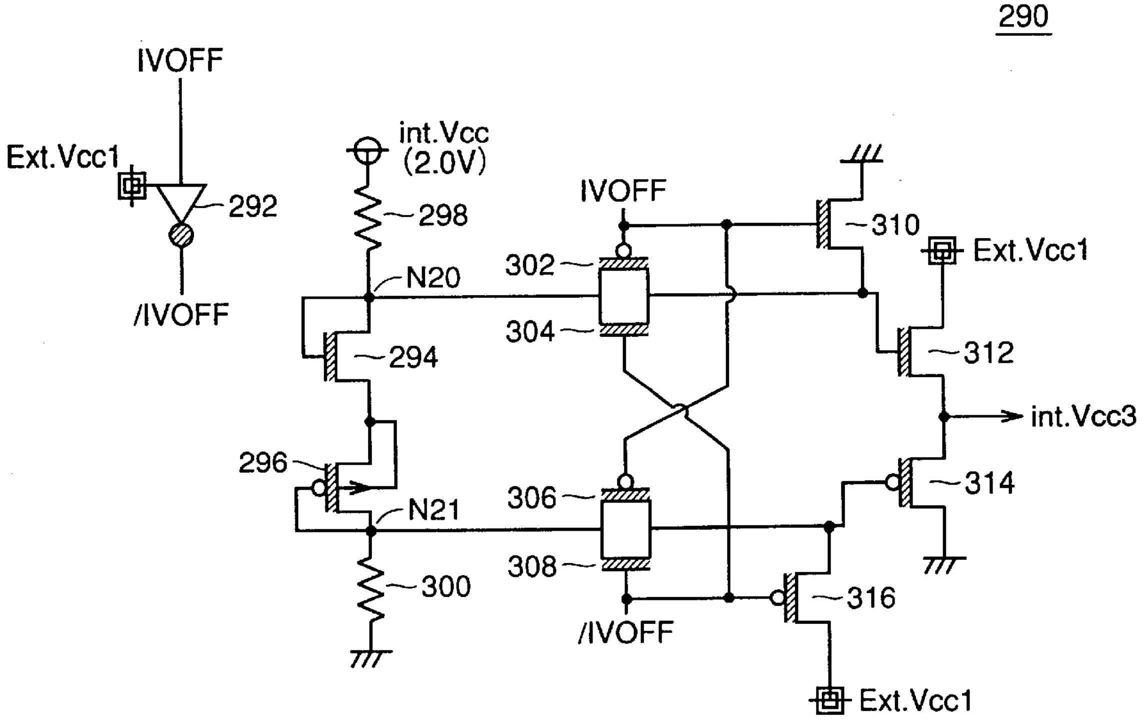
FIG. 13 is a circuit diagram showing a structure of an internal power supply circuit 290 generating a potential that is ½ the power supply potential.

FIG. 13 is a circuit diagram showing a structure of internal power supply circuit 290 generating a potential having the level of ½ the power supply potential.

Referring to FIG. 13, internal power supply circuit 290 includes an inverter 292 receiving and inverting signal IVOFF to output signal /IVOFF, a resistor 298 connected between the node to which internal power supply potential int.Vcc is applied and a node N20, an N channel MOS transistor 294 having its gate and drain connected to a node N20, a P channel MOS transistor 296 having its back gate and source connected to the source of N channel MOS transistor 294, and its gate and drain connected to a node N21, and a resistor 300 connected between node N21 and the ground node.

Internal power supply circuit 290 further includes an N channel MOS transistor 312 and a P channel MOS transistor 314 connected in series between the node to which external power supply potential Ext.Vcc1 is applied and the ground node, an N channel MOS transistor 310 having its drain connected to the gate of N channel MOS transistor 314 and its source connected to the ground node, and receiving signal IVOFF at its gate, and a P channel MOS transistor 316 having its source coupled to external power supply potential Ext.Vcc1, its drain connected to the gate of P channel MOS transistor 314, and receiving signal /IVOFF at its gate.

Internal power supply circuit 290 further includes a P channel MOS transistor 302 and an N channel MOS transistor 304 receiving signals IVOFF and /IVOFF at respective gates to transmit the potential of node N20 to the gate of N channel MOS transistor 312, and a P channel MOS transistor 306 and an N channel MOS transistor 308 receiving signals IVOFF and /IVOFF at respective gates to transmit the potential of node N21 to the gate of P channel MOS transistor 314.

In the case where external power supply potential Ext.Vcc2 has not yet risen when the potential of external power supply potential Ext.Vcc1 is high enough in the foregoing structure, the gate potential of N channel MOS transistor 312 which is the transistor that drives internal power supply circuit 290 attains the level of the ground potential and the potential of P channel MOS transistor 314 attains the level of external power supply potential Ext.Vcc1, which means that these two driver transistors both attain a non conductive state. Therefore, internal power supply potential int.Vcc is not generated.

Thus, through current can be reduced in the level conversion circuit that converts the level of the signal from circuitry with external power supply potential Ext.Vcc2 as the operating power supply potential to circuitry with internal power supply potential int.Vcc as the operating power supply potential.

Fifth Embodiment

In a fifth embodiment of the present invention, the structure of preventing through current in a level conversion circuit will be described.

Figure 14:
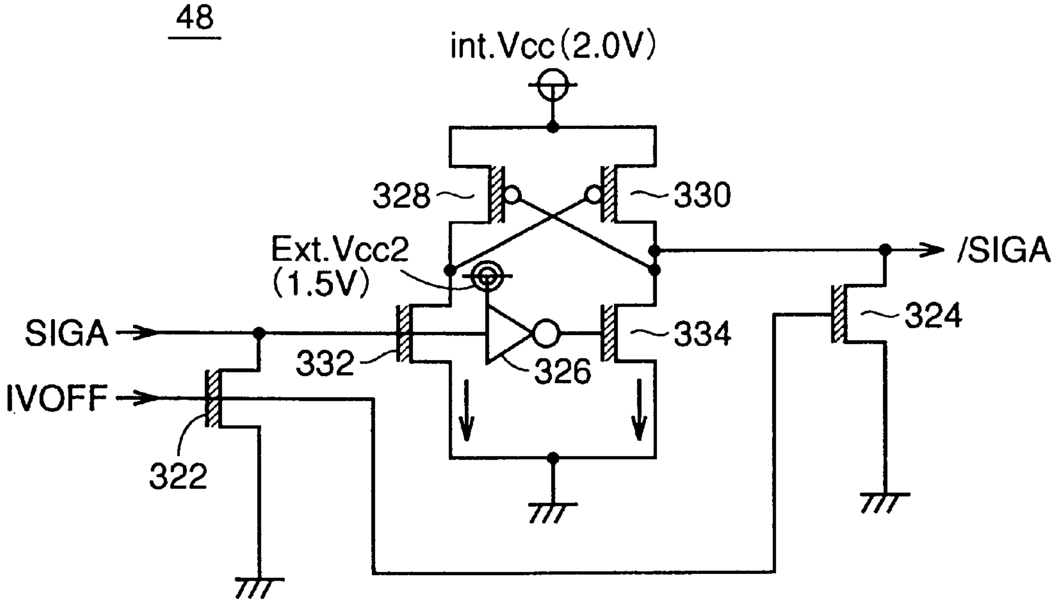
FIG. 14 is a circuit diagram showing a structure of a level conversion circuit 48 according to a fifth embodiment of the present invention.

FIG. 14 is a circuit diagram showing a structure of a level conversion circuit 48 according to a fifth embodiment of the present invention.

Referring to FIG. 14, level conversion circuit 48 includes an N channel MOS transistor 322 receiving signal IVOFF at its gate, having its source connected to the ground node, and receiving signal SIGA at its drain, an inverter 326 receiving and inverting signal SIGA, an N channel MOS transistor 332 receiving signal SIGA at its gate, and having its source connected to the ground node, an N channel MOS transistor 334 receiving the output of inverter 326 at its gate, and having its source connected to the ground node, a P channel MOS transistor 328 connected between the node to which internal power supply potential int.Vcc is applied and the drain of N channel MOS transistor 332, and having its gate connected to the drain of N channel MOS transistor 334, a P channel MOS transistor 330 connected between the node to which internal power supply potential int.Vcc is applied and the drain of N channel MOS transistor 334, and having its gate connected to the drain of N channel MOS transistor 332, and an N channel MOS transistor 324 connected between the drain of N channel MOS transistor 334 and the ground node, and receiving signal IVOFF at its gate.

Signal SIGA has an L level corresponding to 0 V and an H level corresponding to external power supply potential Ext.Vcc2. Inverter 326 receives external power supply potential Ext.Vcc2 as the operating power supply potential to operate. Signal /SIGA having an L level corresponding to 0 V and an H level corresponding to internal power supply potential int.Vcc is output from the drain of N channel MOS transistor 334.

By the above-described structure, through current can be reduced in a level conversion circuit on a path through which a signal is transmitted from row and column address buffer 24 of FIG. 1 to column decoder 28.

Since signal IVOFF is rendered active at an H level when the potential of external power supply potential Ext.Vcc2 is not high enough, signals SIGA and /SIGA are respectively forced to the level of the ground potential by N channel MOS transistors 322 and 324, respectively. Therefore, the through current flowing through N channel MOS transistors 332 and 334 can be removed.

Sixth Embodiment

A sixth embodiment according to the present invention is directed to the structure of sensing the on/off status of the higher external power supply potential in a circuit with the lower internal power supply potential as the operating power supply potential.

Figure 15:
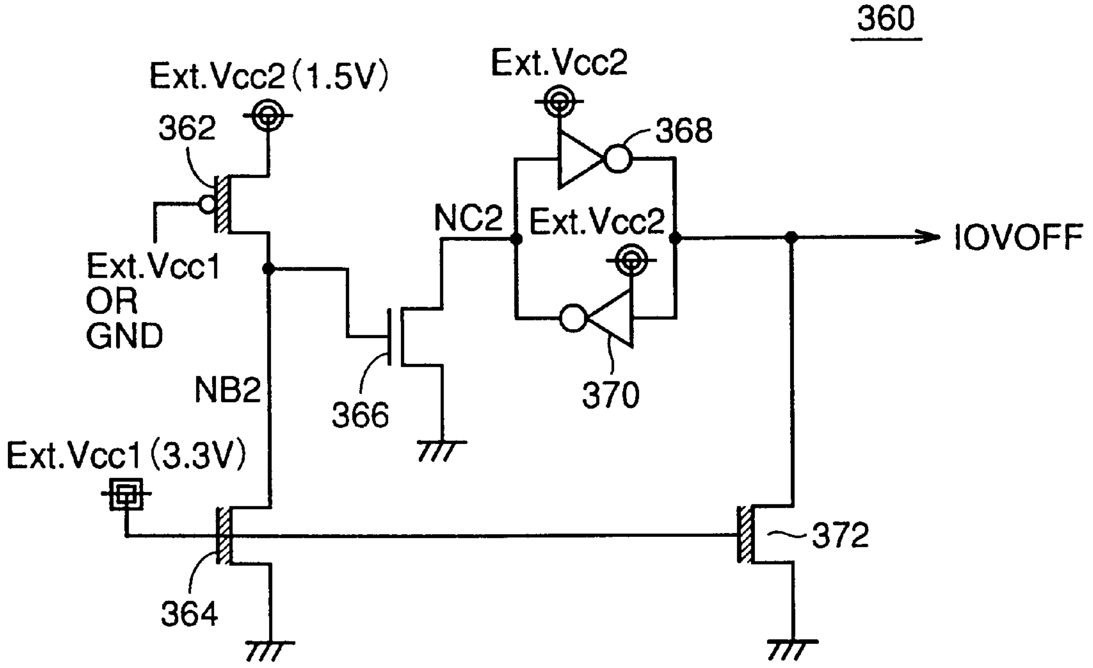
FIG. 15 is a circuit diagram showing a structure of a power supply level sense circuit 360.

FIG. 15 is a circuit diagram showing a structure of a power supply level sense circuit 360.

Referring to FIG. 15, power supply level sense circuit 360 includes a P channel MOS transistor 362 of a large gate length L, receiving ground potential or power supply potential Ext.Vcc2 at its gate, connected between the node to which power supply potential Ext.Vcc2 is applied and a node NB2, an N channel MOS transistor 364 connected between node NB2 and the ground node, and receiving power supply potential Ext.Vcc1 at its gate, an N channel MOS transistor 366 connected between a node NC2 and the ground node, and having its gate connected to node NB2, an inverter 368 having an input connected to node NC2, an inverter 370 receiving and inverting the output of inverter 368 to feedback the inverted output to node NC2, and an N channel MOS transistor 372 connected between the output of inverter 368 and the ground node, and receiving power supply potential Ext.Vcc1 at its gate.

Power supply potential Ext.Vcc2 is applied as the operating power supply potential to inverters 368 and 370. The output of inverter 368 is signal IOVOFF. Signal IOVOFF attains an H level when externally applied power supply potential Ext.Vcc1 is not high enough and attains an L level when power supply potential Ext.Vcc1 is high enough.

Transistors 362, 364 and 372 which are the structural elements of power supply level sense circuit 360 have a gate oxide film of a thickness that can withstand the power supply voltage of Ext.Vcc1. Transistor 366 and inverters 368 and 370 are formed of transistors having a gate oxide film of a thickness that can withstand the power supply voltage of Ext.Vcc2.

When power supply potentials Ext.Vcc1 and Ext.Vcc2 are both high enough, through current flows from power supply potential Ext.Vcc2 to the ground node via node NB2. For the purpose of restricting this current amount, a transistor with a great gate length L is used for P channel MOS transistor 362. The value of power supply potential Ext.Vcc1 at the transition of signal IOVOFF from an H level to an L level is determined according to the balance of the current drivability between inverter 368 and N channel MOS transistor 372.

Output signal IOVOFF serves to identify whether external power supply potential Ext.Vcc1 is on or off. The operating power supply potential of power supply level sense circuit 360 generating this signal IOVOFF corresponds to the lower external power supply potential Ext.Vcc2.

The usage of such a circuit allows the identification of whether external power supply potential Ext.Vcc1 is applied or not.

Seventh Embodiment

In a seventh embodiment of the present invention, the through current in a level conversion circuit that converts a signal having an H level corresponding to higher external power supply potential Ext.Vcc1 into a signal having an H level corresponding to a lower power supply potential Ext.Vcc2 will be described.

Figure 16:
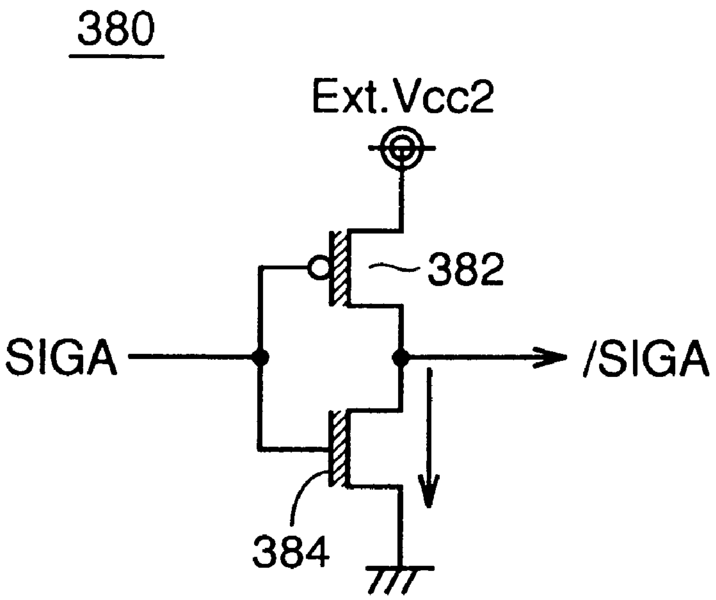
FIG. 16 is a circuit diagram showing a structure of a general level conversion unit 380.

FIG. 16 is a circuit diagram showing a structure of a general level conversion unit 380.

Referring to FIG. 16, level conversion unit 380 includes a P channel MOS transistor 382 receiving signal SIGA at its gate, and having its source coupled to external power supply potential Ext.Vcc2, and an N channel MOS transistor 384 receiving signal SIGA at its gate, and connected between the drain of P channel MOS transistor 382 and the ground node. Signal /SIGA is output from the drain of P channel MOS transistor 382.

Signal SIGA has an L level corresponding to 0 V and an H level corresponding to power supply potential Ext.Vcc1. Signal /SIGA has an L level corresponding to 0 V and an H level corresponding to power supply potential Ext.Vcc2. In the case where external power supply potential Ext.Vcc1 is not yet applied when external power supply potential Ext.Vcc2 is high enough in such a structure, through current will flow if signal SIGA is in the vicinity of the intermediate potential, i.e., in the vicinity exceeding the threshold voltage of N channel MOS transistor 384.

Figure 17:
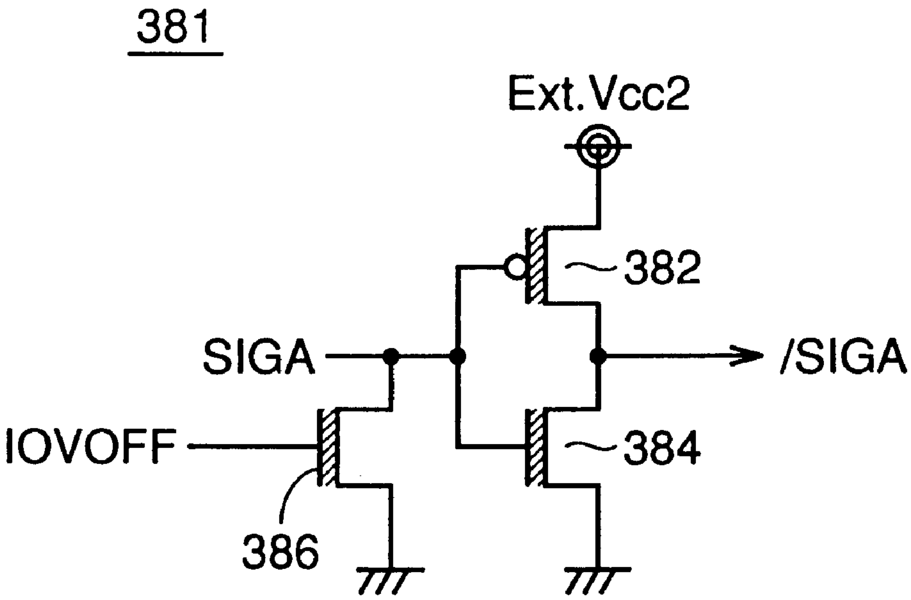
FIG. 17 is a circuit diagram showing a structure of a level conversion unit 381 to reduce through current.

FIG. 17 is a circuit diagram showing a structure of a level conversion unit 381 to reduce the through current.

Referring to FIG. 17, level conversion unit 381 differs in structure from level conversion unit 380 of FIG. 16 in the further provision of an N channel MOS transistor 386 receiving signal IOVOFF described with reference to FIG. 15 at its gate, and connected between the gate of N channel MOS transistor 384 and the ground node. The remaining structure is similar to that of level conversion unit 380. Therefore, description thereof is not repeated.

By this structure, when external power supply potential Ext.Vcc1 is not high enough, N channel MOS transistor 386 is rendered conductive and the gate potential of N channel MOS transistor 384 attains the level of the ground potential. Therefore, through current can be reduced.

The circuit to which signal SIGA of level conversion unit 381 is output is not limited to the internal circuit that operates with external power supply potential Ext.Vcc1 as the operating power supply potential. Level conversion unit 381 is applicable to the case where a signal is to be received from a circuit with any external power supply potential higher than external power supply potential Ext.Vcc2 and an internal power supply potential as the operating power supply potentials.

Eighth Embodiment

In the case where, level conversion circuit 48 shown in FIG. 14, for example, is employed, input signal SIGA is fixed at the level of the ground potential during the time zone where power supply potential int.Vcc is at a predetermined level and external power supply potential Ext.Vcc2 is not yet applied. In the case where signal SIGA is initialized to an H level at the rise of external power supply potential Ext.Vcc2 by a power on reset circuit that receives external power supply potential Ext.Vcc2 to output a reset signal, through current will flow to N channel MOS transistor 322 during the time zone from the rise of external power supply potential Ext.Vcc2 to the fall of signal IVOFF to an L level.

Figure 18:
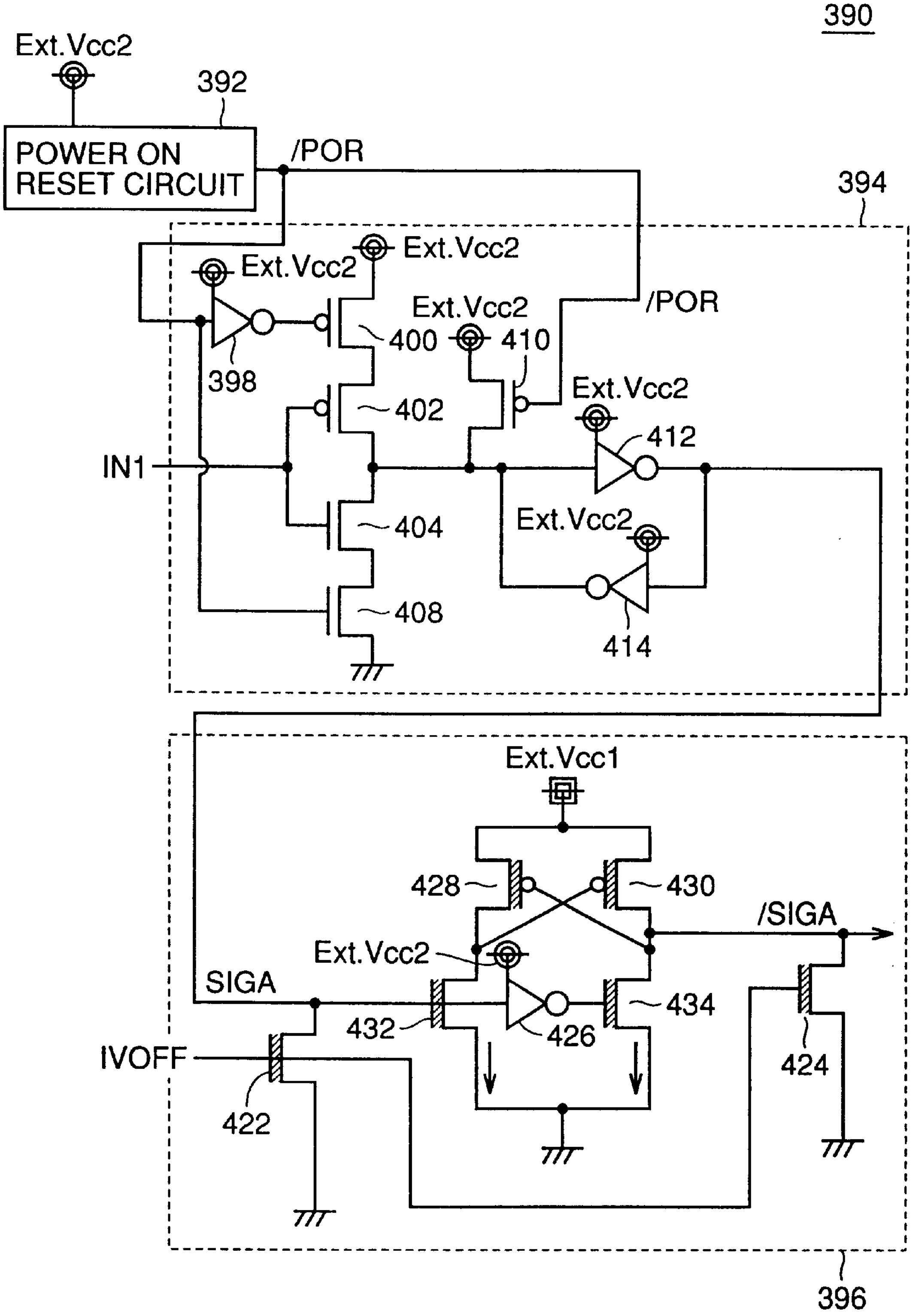
FIG. 18 is a circuit diagram showing a structure of a level conversion circuit 390 according to an eighth embodiment of the present invention.

FIG. 18 is a circuit diagram showing a structure of a level conversion circuit 390 according to the eighth embodiment of the present invention.

Referring to FIG. 18, level conversion circuit 390 includes a power on reset circuit 392 providing a reset signal /POR at the rise of external power supply potential Ext.Vcc2, an input isolation circuit 394 initialized in response to a power on reset signal /POR to receive an input signal IN1 and output signal SIGA, and a level conversion unit 396 converting the level of signal SIGA to output signal /SIGA.

Input isolation circuit 394 includes an inverter 398 receiving and inverting a reset signal /POR, a P channel MOS transistor 400 receiving the output of inverter 398 at its gate, and having its source coupled to external potential Ext.Vcc2, a P channel MOS transistor 402 receiving a signal IN1 at its gate, and having its source connected to the drain of P channel MOS transistor 400, an N channel MOS transistor 404 receiving signal IN1 at its gate, and having its drain connected to the drain of P channel MOS transistor 402, and an N channel MOS transistor 408 receiving reset signal /POR at its gate, and connected between the source of N channel MOS transistor 404 and the ground node.

Input isolation circuit 394 further includes a P channel MOS transistor 410 connected between the node to which power supply potential Ext.Vcc2 is applied and the drain of N channel MOS transistor 404, and receiving reset signal /POR at its gate, an inverter 412 having an input connected to the drain of N channel MOS transistor 404 to output signal SIGA, and an inverter 414 receiving and inverting the output of inverter 412 to feedback the inverted output to the input of inverter 412.

Inverters 398, 412 and 414 receive external power supply potential Ext.Vcc2 as the operating power supply potential to operate.

Level conversion unit 396 further includes an N channel MOS transistor 422 receiving signal IVOFF at its gate, having its source connected to the ground node, and its drain connected to the node to which signal SIGA is applied, an inverter 426 receiving and inverting signal SIGA, an N channel MOS transistor 432 receiving signal SIGA at its gate, and having its source connected to the ground node, an N channel MOS transistor 434 receiving the output of inverter 426 at its gate, and having its source connected to the ground node, a P channel MOS transistor 428 connected between the node to which power supply potential Ext.Vcc1 is supplied and the drain of N channel MOS transistor 432, and having its gate connected to the drain of N channel MOS transistor 434, a P channel MOS transistor 430 connected between the node to which power supply potential Ext.Vcc1 is applied and the drain of N channel MOS transistor 434, and having its gate connected to the drain of N channel MOS transistor 432, and an N channel MOS transistor 424 connected between the drain of N channel MOS transistor 434 and the ground node, and receiving signal IVOFF at its gate.

Signal SIGA has an L level corresponding to 0 V and an H level corresponding to external power supply potential Ext.Vcc2. Inverter 426 receives external power supply potential Ext.Vcc2 as the operating power supply potential to operate. Signal /SIGA having an L level corresponding to 0 V and an H level corresponding to power supply potential Ext.Vcc1 is output from the drain of N channel MOS transistor 434.

Figure 19:
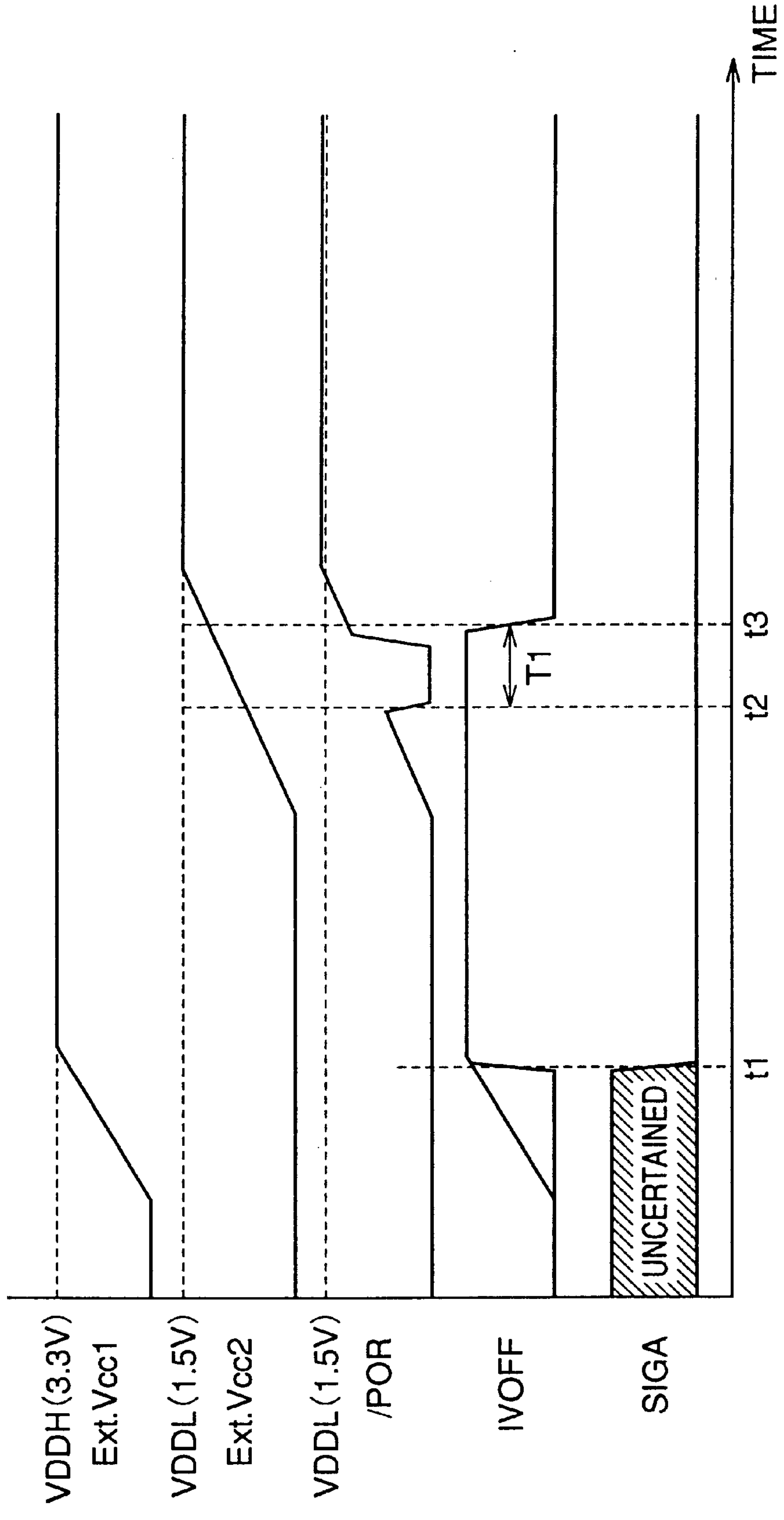
FIG. 19 is an operation waveform diagram to explain an operation of a level conversion circuit 390.

FIG. 19 is an operation waveform diagram to describe the operation of level conversion circuit 390.

Referring to FIGS. 18 and 19, at the rise of power supply potential Ext.Vcc1 to the level of potential VDDH, signal IVOFF is ascertained at an H level and signal SIGA is ascertained at an L level at time t1.

As power supply potential Ext.Vcc2 begins to rise, power on reset circuit 392 renders reset signal /POR active at an L level at time t2.

In response to the rise of power supply potential Ext.Vcc2, power on reset circuit 392 renders reset signal /POR inactive at an H level at time t3. Input isolation circuit 394 has its reset canceled to receive input signal IN1 to output the received signal as signal SIGA.

During a period of time T1 of time t2–t3, the clocked inverter formed of transistors 400, 402, 404 and 408 is rendered inactive by reset signal /POR. The node to which input signal IN1 is applied is disconnected from the input of inverter 412 that outputs signal SIGA.

The input of inverter 412 is fixed at an H level by P channel MOS transistor 410. In response, signal SIGA is driven to an L level, matching the set value that is set when signal IVOFF is at an H level. Therefore, the through current flowing to N channel MOS transistor 422 can be reduced irrespective of the initial state of input signal IN1.

Various modifications are possible to obtain the same advantage as long as the structure will not have input signal IN1 affect signal SIGA in a power on reset period. For example, when the distance through which input signal IN1 is transmitted is short, input signal IN1 can be transmitted as signal SIGA by a transmission gate that is at a conductive state during the normal period instead of receiving input signal IN1 at the clocked inverter. By providing control so that the transmission gate is at a non conductive state during the power on reset period, a similar effect can be achieved without P channel MOS transistor 410 and inverters 412 and 414.

OTHER APPLICATIONS

Figure 20:
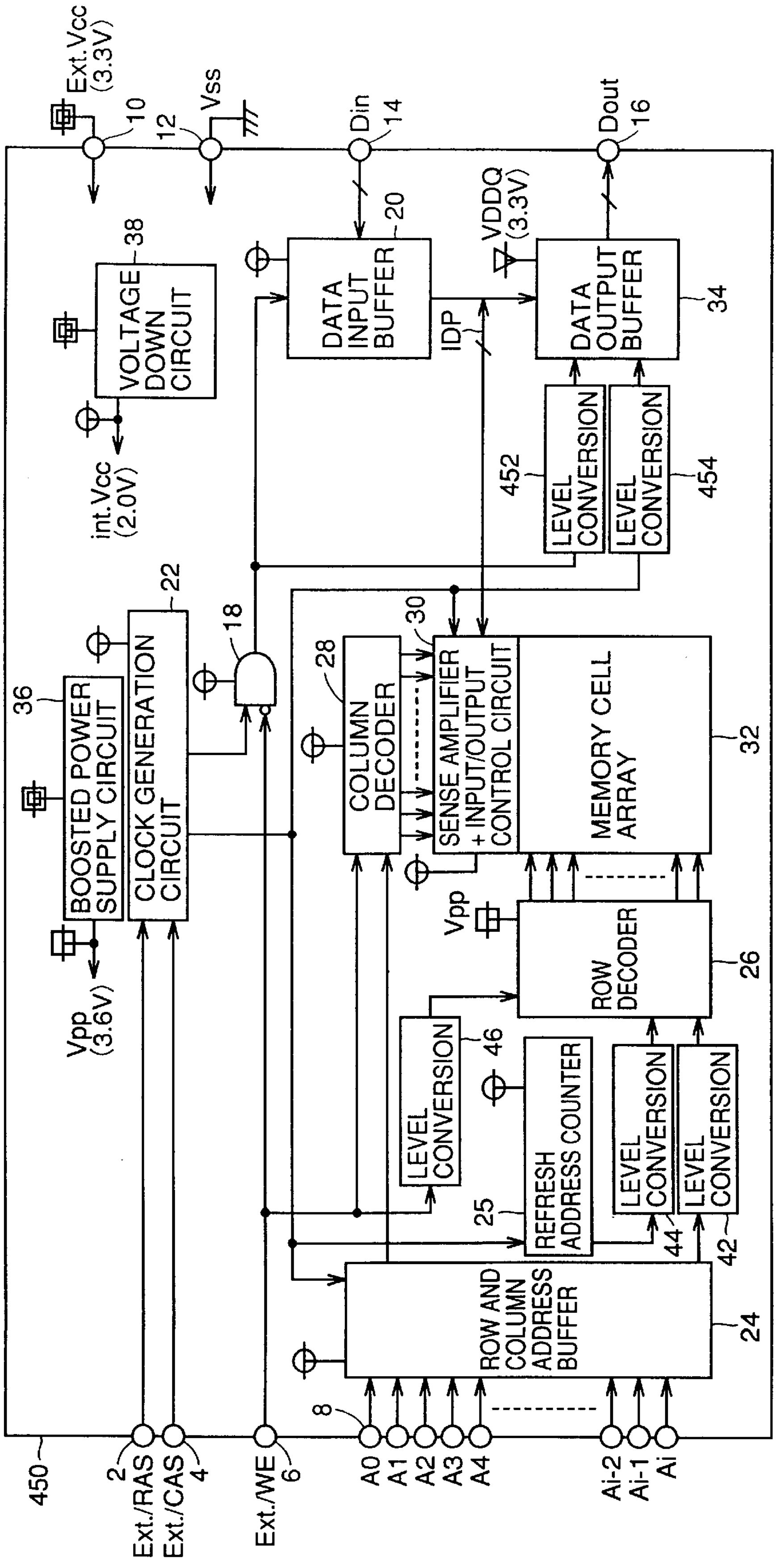
FIG. 20 is a block diagram showing a structure of a DRAM operating with a single power supply.

FIG. 20 is a block diagram showing a structure of a DRAM that operates with a single power supply.

The present invention is not limited to the application to a semiconductor device receiving a plurality of externally applied power supply potentials as shown in FIG. 1. The present invention is also applicable to a structure where a single external power supply potential is received and internal boosted potential Vpp or internal power supply potential int.Vcc is generated by boosted power supply circuit 36 or voltage down circuit 38, as shown in FIG. 20.

In semiconductor device 450, power supply potential Ext.Vcc is 3.3 V, internal boosted potential Vpp is 3.6 V, and internal power supply potential int.Vcc is 2.0 V.

In semiconductor device 450, gate circuit 18, clock generation circuit 22, data input buffer 20, row and column address buffer 24, refresh address counter 25, data output buffer 34, column decoder 28, and sense amplifier+input/output control circuit 30 receive internal power supply potential int.Vcc as the operating power supply potential. Row decoder 26 receives internal boosted potential Vpp as the operating power supply potential. This internal boosted potential corresponds to the activation level of the word line.

Semiconductor device 450 includes level conversion circuits 42–46, 452 and 454 that convert the level of a signal between circuits with different power supply potentials as the operating power supply potential. By applying the present invention to such level conversion circuits, the through current can be reduced to lower power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a first terminal receiving a first power supply potential;

a second terminal receiving a second power supply potential;

a sense circuit receiving an operating power supply potential from said first terminal to sense the potential of said second terminal; and an internal circuit receiving an input signal applied according to the potential of said second terminal to operate according to an output of said sense circuit, wherein said internal circuit includes:

a level conversion circuit rendered active according to an output of said sense circuit to convert said input signal having an amplitude corresponding to said second power supply potential into an output signal having an amplitude corresponding to said first power supply potential, and a circuit receiving supply of an operating current from said first terminal to operate according to an output of said level conversion circuit.

2. The semiconductor device according to claim 1, wherein said first power supply potential has a level of at least said first power supply potential.

3. The semiconductor device according to claim 1, wherein said second power supply potential has a level of at least said first power supply potential.

4. The semiconductor device according to claim 1, wherein said level conversion circuit includes a first switch circuit coupling an input node receiving said input signal to a first fixed potential according to an output of said sense circuit.

5. The semiconductor device according to claim 4, wherein said level conversion circuit further includes a second switch circuit coupling an output node from which said output signal is output to a second fixed potential according to an output of said sense circuit.

6. A semiconductor device comprising:

a first terminal receiving a first power supply potential;

a second terminal receiving a second power supply potential;

a sense circuit receiving an operating power supply potential from said first terminal to sense the potential of said second terminal; and an internal circuit receiving an input signal applied according to the potential of said second terminal to operate according to an output of said sense circuit, wherein said internal circuit includes an internal power supply circuit rendered active according to an output of said sense circuit to generate an internal power supply potential from said first power supply potential, and a circuit receiving supply of an operating current from said internal power supply circuit to operate according to said input signal.

7. The semiconductor device according to claim 6, wherein said sense circuit ceases generation of said internal power supply potential to said internal power supply circuit when the potential of said second terminal has not arrived at a predetermined potential.

8. The semiconductor device according to claim 6, wherein said internal power supply circuit includes a level detection circuit detecting whether said internal power supply potential has arrived at a predetermined potential or not, an oscillator rendered active to oscillate according to an output of said level detection circuit and an output of said sense circuit, and a charge pump circuit boosting said first power supply potential according to an output of said oscillator to generate said internal power supply potential.

9. The semiconductor device according to claim 6, wherein said internal power supply circuit includes a drive transistor coupling an output node supplying said internal power supply potential to said first power supply potential, and a comparison circuit rendered active according to an output of said sense circuit to compare a potential of said output node with a reference potential and control a conductive state of said drive transistor, said comparison circuit rendering said drive transistor nonconductive during its own inactivation period.

10. A semiconductor device comprising:

first terminal receiving a first power supply potential;

a second terminal receiving a second power supply potential;

a sense circuit receiving an operating power supply potential from said first terminal to sense the potential of said second terminal; and an internal circuit receiving an input signal applied according to the potential of said second terminal to operate according to an output of said sense circuit;

a power on reset circuit observing a potential of said second terminal to output a reset signal, wherein said internal circuit includes an input node receiving said input signal, an internal node to which a signal according to a potential of said input node is transmitted in a normal operation, an input isolation circuit driving said internal node according to a potential of said input node when said reset signal is inactive, and isolating said input node from said internal node so as to obviate influence to said internal node when said reset signal is active, a switch circuit coupling said internal node to a predetermined fixed potential according to an output of said sense circuit, and a circuit receiving supply of an operating current from said first terminal to operate according to a potential of said internal node.

11. The semiconductor device according to claim 10, wherein said input isolation circuit drives the potential of said internal node to said predetermined fixed potential when said reset signal is active.

12. A semiconductor device comprising:

a first terminal receiving a first power supply potential;

a second terminal receiving a second power supply potential;

a sense circuit receiving an operating power supply potential from said first terminal to sense the potential of said second terminal; and an internal circuit receiving an input signal applied according to the potential of said second terminal to operate according to an output of said sense circuit;

a reference potential generation circuit generating a stable first reference potential from said first power supply potential; and a first circuit operating using said first reference potential, wherein said sense circuit includes a potential generation unit generating a second reference potential according to an output of said reference potential generation circuit, and a first potential comparison unit comparing said second reference potential with a potential of said second terminal.

13. The semiconductor device according to claim 12, wherein said first circuit includes a second potential comparison unit comparing said first reference potential with an internal power supply potential, and a drive circuit receiving said first power supply potential to drive said internal power supply potential according to an output of said potential comparison unit.

* * * * *